(12) United States Patent
Wang et al.

(10) Patent No.: US 9,293,520 B2
(45) Date of Patent: Mar. 22, 2016

(54) METHOD OF FORMING SUBSTRATE CONTACT FOR SEMICONDUCTOR ON INSULATOR (SOI) SUBSTRATE

(71) Applicant: GLOBALFOUNDRIES INC., Cayman Islands (KY)

(72) Inventors: Geng Wang, Stormville, NY (US); Roger A. Booth, Jr., Wappingers Falls, NY (US); Kangguo Cheng, Schenectady, NY (US); Joseph Ervin, Hopewell Junction, NY (US); Chengwen Pei, Danbury, CT (US); Ravi M. Todi, San Diego, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 139 days.

(21) Appl. No.: 13/845,560

(22) Filed: Mar. 18, 2013

(65) Prior Publication Data

US 2013/0214382 A1      Aug. 22, 2013

Related U.S. Application Data

(62) Division of application No. 12/959,824, filed on Dec. 3, 2010, now Pat. No. 8,647,945.

(51) Int. Cl.
| | |
|---|---|
| H01L 21/70 | (2006.01) |
| H01L 49/02 | (2006.01) |
| H01L 21/762 | (2006.01) |
| H01L 21/74 | (2006.01) |
| H01L 21/84 | (2006.01) |
| H01L 27/108 | (2006.01) |
| H01L 27/12 | (2006.01) |
| H01L 29/66 | (2006.01) |
| H01L 29/06 | (2006.01) |
| H01L 21/02 | (2006.01) |

(52) U.S. Cl.
CPC .............. *H01L 28/40* (2013.01); *H01L 21/743* (2013.01); *H01L 21/76224* (2013.01); *H01L 21/76229* (2013.01); *H01L 21/84* (2013.01); *H01L 27/1087* (2013.01); *H01L 27/1203* (2013.01); *H01L 28/91* (2013.01); *H01L 29/0649* (2013.01); *H01L 29/66181* (2013.01); *H01L 21/0262* (2013.01); *H01L 21/02529* (2013.01); *H01L 21/02532* (2013.01)

(58) Field of Classification Search
CPC .................................................. H01L 29/66181
See application file for complete search history.

(56) References Cited

U.S. PATENT DOCUMENTS

| | | |
|---|---|---|
| 4,549,927 A | 10/1985 | Goth et al. |
| 5,217,920 A | 6/1993 | Mattox et al. |

(Continued)

*Primary Examiner* — Matthew W Such
*Assistant Examiner* — Abul Kalam
(74) *Attorney, Agent, or Firm* — Scully Scott Murphy and Presser

(57) ABSTRACT

A semiconductor structure is provided that includes a material stack including an epitaxially grown semiconductor layer on a base semiconductor layer, a dielectric layer on the epitaxially grown semiconductor layer, and an upper semiconductor layer present on the dielectric layer. A capacitor is present extending from the upper semiconductor layer through the dielectric layer into contact with the epitaxially grown semiconductor layer. The capacitor includes a node dielectric present on the sidewalls of the trench and an upper electrode filling at least a portion of the trench. A substrate contact is present in a contact trench extending from the upper semiconductor layer through the dielectric layer and the epitaxially semiconductor layer to a doped region of the base semiconductor layer. A substrate contact is also provided that contacts the base semiconductor layer through the sidewall of a trench. Methods for forming the above-described structures are also provided.

14 Claims, 9 Drawing Sheets

(56) References Cited

U.S. PATENT DOCUMENTS 6,498,069 B1 * 12/2002 Grivna .......................... 438/386
2006/0202249 A1 * 9/2006 Cheng et al. .................. 257/301
2009/0174031 A1 * 7/2009 Wang et al. ................... 257/532
2009/0267146 A1 * 10/2009 Pan .............................. 257/336
2011/0309441 A1 * 12/2011 Stecher et al. ................ 257/338

* cited by examiner

METHOD OF FORMING SUBSTRATE CONTACT FOR SEMICONDUCTOR ON INSULATOR (SOI) SUBSTRATE

CROSS REFERENCE TO RELATED APPLICATION

This application is a divisional of U.S. patent application Ser. No. 12/959,824, filed Dec. 3, 2010 the entire content and disclosure of which is incorporated herein by reference.

FIELD OF THE INVENTION

The present disclosure relates to semiconductor devices and interconnects to semiconductor devices.

In bulk semiconductor substrates, the active semiconductor region of a transistor is disposed in a well region of an oppositely doped bulk semiconductor region. In such structure, junction capacitance between the well and the bulk semiconductor region can impact performance. Some microelectronic devices have active semiconductor regions in a silicon-on-insulator ("SOT") layer of an SOT substrate. The SOT layer is separated from the main or "bulk" semiconductor region of the substrate by an insulating layer such as a buried oxide ("BOX") layer or other dielectric layer. The insulating layer improves performance by eliminating junction capacitance between the SOT layer and the bulk semiconductor region.

SUMMARY

In one embodiment, the present disclosure provides a method of forming a contact to base semiconductor layer of a substrate having a semiconductor on insulator (SOT) substrate configuration. The base semiconductor layer is a semiconductor layer of the substrate that is underlying a buried dielectric layer. In one embodiment, a method of forming a semiconductor device is provided that includes providing a material stack on a base semiconductor layer. The material stack may include an epitaxially grown semiconductor layer on the base semiconductor layer, a dielectric layer on the epitaxially grown semiconductor layer, and an upper semiconductor layer present on the dielectric layer. An etch mask may be formed on an upper surface of the upper semiconductor layer. The etch mask includes a contact opening, an isolation opening and a capacitor opening. An etch process in conjunction with the etch mask can provide a contact trench that is in contact with the base semiconductor layer, a isolation trench that is in contact with the base semiconductor layer, and a capacitor trench having a base portion present in the epitaxially grown semiconductor layer. A conformal dielectric may be formed on the contact trench, the isolation trench and the capacitor trench. A portion of the conformal dielectric is removed from a base portion of the contact trench. A dopant region is formed in the base semiconductor layer of the substrate at the base portion of the contact trench. The contact trench, the isolation trench and the capacitor trench may then be filled with a conductive material.

In another aspect of the present disclosure, a semiconductor structure is provided that includes a substrate contact and at least one capacitor. In one embodiment, the semiconductor structure includes a material stack on a base semiconductor layer. The material stack includes an n-type semiconductor layer on the base semiconductor layer, a dielectric layer on the n-type semiconductor layer, and an upper semiconductor layer present on the dielectric. A capacitor may be present in a capacitor trench extending from the upper semiconductor layer through the dielectric layer into contact with the n-type semiconductor layer. The capacitor may include a node dielectric present on the sidewalls of the trench and an upper electrode filling at least a portion of the trench. The substrate contact may be present in a contact trench extending from the upper semiconductor layer through the dielectric layer and the n-type semiconductor layer to a p-type doped region of the base semiconductor layer.

In another embodiment, a method of forming a semiconductor device is provided that includes providing an upper semiconductor layer on a dielectric layer, wherein the dielectric layer is present on a base semiconductor layer, and forming an etch mask on an upper surface of the upper semiconductor layer. The etch mask may include a contact opening having a first width and a capacitor opening having a second width, wherein the first width is of a dimension that is greater than 2 times the value of the second width. A contact trench and a capacitor trench are etched into contact with the base semiconductor layer. A conformal dielectric layer is formed on the contact trench and the capacitor trench. The conformal dielectric layer is recessed within the contact trench and the capacitor trench with an anisotropic etch. A first remaining portion of the conformal dielectric layer that is present in the contact trench is recessed below the upper surface of base semiconductor layer to expose a sidewall portion of the base semiconductor layer within the contact trench. A second remaining portion of the conformal dielectric layer that is present in the capacitor trench is present on an entirety of the sidewalls and base portions of the capacitor trench that is present in the base semiconductor layer. The contact trench and the capacitor trench are filled with a conductive material.

In another aspect, a semiconductor structure is provided that includes a capacitor formed in a semiconductor on insulator (SOI) substrate and a substrate contact to the base semiconductor layer of the semiconductor on insulator (SOI) substrate. In one embodiment, the semiconductor structure includes a semiconductor on insulator (SOI) substrate that includes an upper semiconductor layer, a dielectric layer, and a base semiconductor layer. A substrate contact is present in a first trench extending from an upper surface of the semiconductor layer through the dielectric layer into contact with the base semiconductor layer. The substrate contact includes a conductive fill material that is in direct contact with the base semiconductor layer through a sidewall portion of the trench. The conductive fill of the substrate contact is separated from the base portion of the trench by a conformal dielectric layer. A capacitor is present in a second trench that includes a buried plate, a node dielectric layer and an upper electrode. The node dielectric layer is present on an entirety of the sidewalls and base portions of the second trench that is present in the base semiconductor layer. The node dielectric layer is identical in composition to the conformal dielectric layer.

DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE INVENTION

Figure 1:
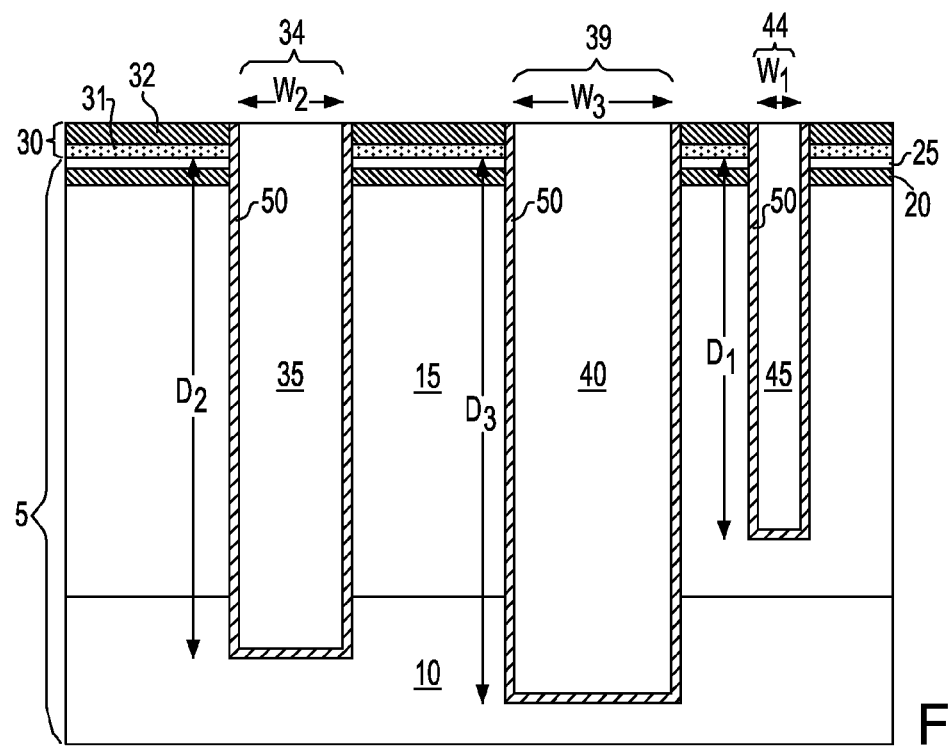
FIG. 1 is a side cross-sectional view of an initial structure used in one embodiment of a method of forming a contact to a base semiconductor layer of a semiconductor substrate, in which the initial structure has been etched to provide a contact trench into contact with the base semiconductor layer, an isolation trench into contact with the base semiconductor layer, and a capacitor trench having a base portion present in an epitaxially grown semiconductor layer, in accordance with the present disclosure.

Detailed embodiments of the present disclosure are described herein; however, it is to be understood that the disclosed embodiments are merely illustrative of the invention that may be embodied in various forms. In addition, each of the examples given in connection with the various embodiments of the disclosure is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

FIGS. 1-5 depict one embodiment of a method for forming a contact to the base semiconductor layer 10 of a semiconductor on insulator (SOI) substrate 5. The semiconductor on insulator (SOI) substrate 5 that includes an epitaxially grown semiconductor layer 15 atop a base semiconductor layer 10, and a dielectric layer 20, i.e., buried dielectric layer is present atop the epitaxially grown semiconductor layer 15. In one embodiment, the epitaxially grown semiconductor layer 15 is doped with an n-type dopant and the base semiconductor layer 10 is doped with a p-type dopant. Since the p-type doped region is buried below the dielectric layer 20, it is floating unless a contact is realized to bias the substrate 5 to a specific electrical bias, which is normally ground. When it is floating, the electrical potential in the p-type base semiconductor layer 10 can fluctuate and be affected by n-type epitaxially grown semiconductor region 15 that is locally adjacent to it. This resembles the floating body effect in the upper semiconductor layer of SOI substrates, and can cause leakage and noise issues. In some embodiments, in order to substantially eliminate the negative effects of the floating body, the methods and structures of the present disclosure provide a contact to the base semiconductor layer 10 of the semiconductor on insulator (SOI) substrate 5.

FIG. 1 illustrates the results of the initial processing steps that produce a semiconductor on insulator (SOI) substrate 5 that includes an epitaxially grown semiconductor layer 15 that is present between dielectric layer 20 and the base semiconductor layer 10. The semiconductor on insulator substrate 5 also includes an upper semiconductor layer 25 that is overlying the dielectric layer 20.

The base semiconductor layer 10 may be composed of any semiconducting material including, but not limited to Si, strained Si, SiC, SiGe, SiGeC, Si alloys, Ge, Ge alloys, GaAs, InAs, and InP, or any combination thereof. In the embodiments that are depicted in FIGS. 1-5 the base semiconductor layer 10 is composed of a silicon containing material. For example, the base semiconductor layer 10 may be composed of silicon having a p-type conductivity type. As used herein, the term "conductivity type" denotes a dopant region being p-type or n-type. The term "p-type" refers to the addition of impurities to an intrinsic semiconductor that creates deficiencies of valence electrons. In a silicon containing material, examples of p-type dopants, i.e., impurities, include but are not limited to: boron, aluminum, gallium and indium. The p-type dopant may be introduced to the base semiconductor layer 10 by ion implantation or by an insitu doping process that is employed while the material of the base semiconductor layer 10 is being formed. The concentration of p-type dopant that is present in the base semiconductor layer 10 is typically greater than $1 \times 10^{15}$ atoms/cm$^3$. In another embodiment, the concentration of the p-type dopant that is present in the base semiconductor layer 10 ranges from $1 \times 10^{16}$ atoms/cm$^3$ to $1 \times 10^{17}$ atoms/cm$^3$. The p-type dopant may be boron, but aluminum, gallium and indium may also be employed. In one embodiment, the base semiconductor layer 10 has a thickness ranging from 25 µm to 500 µm. In another embodiment, the first semiconductor layer 4 has a thickness ranging from 50 µm to 100 µm.

The epitaxially grown semiconductor layer 15 is formed on an upper surface of the base semiconductor layer 10. The epitaxially grown semiconductor layer 15 is composed of any semiconducting material including, but not limited to Si, strained Si, SiC, SiGe, SiGeC, Si alloys, Ge, Ge alloys, GaAs, InAs, and InP, or any combination thereof.

"Epitaxial growth and/or deposition" means the growth of a semiconductor material on a deposition surface of a semiconductor material, in which the semiconductor material being grown has the same crystalline characteristics as the semiconductor material of the deposition surface. Thus, an epitaxial film deposited on a <111> crystal surface will take on a <111> orientation. If, on the other hand, the wafer surface has an amorphous surface layer, possibly the result of implanting, the depositing atoms have no surface to align to, resulting in the formation of polysilicon instead of single crystal silicon.

A number of different sources may be used for the deposition of epitaxially grown semiconductor layer 15. Silicon sources for epitaxial growth include silicon tetrachloride, dichlorosilane (SiH$_2$Cl$_2$), and silane (SiH$_4$). The temperature for epitaxial silicon deposition may range from 750° C. to 900° C. Although higher temperature typically results in faster deposition, the faster deposition may result in crystal defects and film cracking.

In the example that is depicted in FIG. 1, the epitaxially grown semiconductor layer 15 is composed of silicon (Si). In other embodiments, the epitaxially grown semiconductor layer 15 may be composed of silicon germanium (SiGe). In the embodiments, in which the epitaxially grown semiconductor layer 15 is composed of silicon germanium (SiGe), the Ge content may range from 5% to 50%, by atomic weight %. In another embodiment, the Ge content of the epitaxial grown SiGe may range from 10% to 20%.

In one embodiment, the epitaxially grown semiconductor layer 15 is doped with an n-type conductivity dopant. As used herein, "n-type" refers to the addition of impurities that contribute free electrons to an intrinsic semiconductor, such as antimony, arsenic or phosphorous to a Si-containing material. The n-type dopant may be introduced to the epitaxially grown semiconductor layer 15 during the epitaxial growth process that forms the layer. In one embodiment, in which the epitaxially grown semiconductor layer 15 is doped to provide an n-type conductivity, the dopant may be phosphorus present in a concentration ranging from $1 \times 10^{18}$ atoms/cm$^3$ to $5 \times 10^{21}$ atoms/cm$^3$. In one embodiment, in which the epitaxially grown semiconductor layer 15 is doped to provide an n-type conductivity, the dopant may be phosphorus present in a concentration ranging from $1 \times 10^{19}$ atoms/cm$^3$ to $1 \times 10^{20}$ atoms/cm$^3$.

The epitaxially grown semiconductor layer 15 may have a thickness that is greater than 1 µm. In one embodiment, the epitaxially grown semiconductor layer 15 has a thickness that ranges from 1 µm to 5 µm. In yet another embodiment, the epitaxially grown semiconductor layer 15 has a thickness that is greater than 3 µm. In one example, the epitaxially grown semiconductor layer 15 has a thickness that is equal to 4.0 µm.

The dielectric layer 20, i.e., buried dielectric layer, may be an oxide, such as silicon oxide, a nitride, such as silicon nitride, or an oxynitride, such as silicon oxynitride. In one example, the dielectric layer 20 is composed of silicon oxide (SiO$_2$). In one embodiment, the dielectric layer 20 has a thickness ranging from 5.0 nm to 400.0 nm. In another embodiment, the dielectric layer 20 has a thickness ranging from 50.0 nm to 200.0 nm.

In one embodiment, the dielectric layer 20 may be deposited or grown prior on the epitaxially grown semiconductor layer 15. For example, in one embodiment, the dielectric layer 20 may be formed by a deposition process, such as chemical vapor deposition (CVD). Chemical vapor deposition is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (EPCVD), Metal-Organic CVD (MOCVD) and combinations thereof. In another example, the dielectric layer 20 is formed using a thermal growth process, such as thermal oxidation.

The upper semiconductor layer 25 may be composed of any semiconducting material including, but not limited to, Si, strained Si, SiC, SiGe, SiGeC, Si alloys, Ge, Ge alloys, GaAs, InAs, and InP, or any combination thereof. In one embodiment, the upper semiconductor layer 25 has a thickness ranging from 5.0 nm to 200.0 nm. In another embodiment, the upper semiconductor layer 25 has a thickness ranging from 40.0 nm to 100 nm. In one embodiment, the upper semiconductor layer 25 may be deposited on the dielectric layer 20. For example, the upper semiconductor layer 25 may be formed by a deposition process, such as chemical vapor deposition (CVD). Variations of CVD processes include, but are not limited to, Atmospheric Pressure CVD (APCVD), Low Pressure CVD (LPCVD), Plasma Enhanced CVD (EPCVD), Metal-Organic CVD (MOCVD) and combinations thereof. The upper semiconductor layer 25 may also be formed by evaporation, spin-on coating, or chemical solution deposition. In the example that is depicted in FIG. 1, the upper semiconductor layer 25 is composed of silicon.

In addition to the above-described method of forming the semiconductor on insulator (SOI) substrate 5, the semiconductor on insulator (SOI) substrate 5 may also be formed using wafer-bonding techniques, where adjacent material layers are formed and then joined utilizing glue, adhesive polymer, or direct bonding.

A pad dielectric stack 30 may be formed on the upper surface of the SOI substrate 5. The pad dielectric stack 30 may include a nitride containing pad dielectric layer 31 that is present on the upper surface of the SOI substrate 5, and a hard mask dielectric layer 32 that is present on the upper surface of the nitride containing pad dielectric layer 31. The nitride containing pad dielectric layer 31 may be composed of any nitride containing material, such as silicon nitride ($Si_3N_4$) or silicon oxynitride ($SiO_xN_y$). The nitride containing pad dielectric layer 31 is typically formed by a deposition process, such as chemical vapor deposition (CVD). The nitride containing pad dielectric layer 31 may have a thickness ranging from 50 nm to 200 nm. In another example, the nitride containing pad dielectric layer 31 has a thickness ranging from 100 nm to 150 nm. The hard mask dielectric layer 32 may be composed of an oxide containing material, such as silicon oxide ($SiO_2$). The hard mask dielectric layer 32 may also be composed of silicon carbides, silicon nitrides, silicon carbonitrides, silsequioxanes, siloxanes, borosilicate glass (BSG), and boron phosphate silicate glass (BPSG). The hard mask dielectric layer 32 is typically formed by a deposition process, such as chemical vapor deposition (CVD) or spin on deposition. The hard mask dielectric layer 32 may have a thickness ranging from 50 nm to 1000 nm. In another example, the hard mask dielectric layer 32 has a thickness ranging from 300 nm to 500 nm. It is noted that the above-described pad dielectric stack 30 is provided for illustrative purposes only, and is not intended to limit the present disclosure. Any number of material layers and any number of compositions may be employed in the pad dielectric stack 30, so long as the pad dielectric stack facilitates the selective etch process that provides the contact trench 35, isolation trench 40 and capacitor trench 45.

FIG. 1 depicts one embodiment of using the pad dielectric stack 30 as an etch mask to form a contact trench 35, an isolation trench 40 and a capacitor trench 45 in the semiconductor on insulator (SOI) substrate 5. The etch process that provides the contact trench 35, an isolation trench 40 and a capacitor trench 45 may be an anisotropic etch. As used herein, an "anisotropic etch process" denotes a material removal process in which the etch rate in the direction normal to the surface to be etched is higher than in the direction parallel to the surface to be etched. One form of anisotropic etching that is suitable for forming the contact trench 35, the isolation trench 40 and the capacitor trench 45 is reactive ion etching (RIE). Reactive ion etching (RIE) is a form of plasma etching in which during etching the surface to be etched is exposed to reactive gases in the presence of an RF field. During RIE the surface to be etched takes on a potential that accelerates the reactive species extracted from a plasma toward the surface, in which the chemical etching reaction is taking place in the direction normal to the surface.

Prior to etching the semiconductor on insulator (SOI) substrate 5, the pad dielectric stack 30 is pattered and etched to provide an etch mask. In one embodiment, a pattern is produced by applying a photoresist (not shown) to the surface to be etched, exposing the photoresist to a pattern of radiation, and then developing the pattern into the photoresist utilizing a resist developer to provide a photoresist mask (not shown). Once the patterning of the photoresist is completed, the sections of the pad dielectric stack 30 covered by the photoresist are protected, while the exposed potions are removed using a selective etching process that removes the unprotected regions. As used herein, the term "selective" in reference to a material removal process denotes that the rate of material removal for a first material is greater than the rate of removal for at least another material of the structure to which the material removal process is being applied.

For example, in one embodiment, following the formation of the photoresist mask, a selective etch process can remove the exposed portion of the hardmask dielectric layer 32 selective to, i.e., stopping on, the nitride containing pad dielectric layer 31. Thereafter, the exposed portions of the nitride containing pad dielectric layer 31 may be etched selective to the upper semiconductor layer 25 to provide the etch mask, which is composed of the remaining portions of the pad dielectric stack 30. The etch mask includes a contact opening 34, an isolation opening 39 and a capacitor opening 44.

The capacitor opening 44 has a first width W1, the contact opening 34 has a second width W2, and the isolation opening 39 has a third width W3, wherein the third width W3 is greater than the second width W2 and the second width W2 is greater than the first width W1. The second width W2 of the contact trench can be larger than the third width W3 of the isolation trench, but it is sufficient for the second width W2 to be greater than first width W1. The first width W1 of the capacitor opening 44 may range from 0.03 µm to 0.2 µm. In another embodiment, the first width W1 of the capacitor opening 44 may range from 0.06 µm to 0.1 µm. The second width W2 of the contact opening 34 may range from 0.10 µm to 0.5 µm. In another embodiment, the second width W2 of the contact opening 34 may range from 0.2 µm to 0.3 µm. In one example, second width W2 of the contact opening 34 may be 0.25 µm. The third width W3 of the isolation opening 39 may range from 0.1 µm to 1.0 µm. In another embodiment, the third width W3 of the isolation opening 39 may range from 0.2 µm to 0.5 µm.

Following the formation of the etch mask, the semiconductor on insulator (SOI) substrate 5 may be etched to form the contact trench 35, the isolation trench 40 and the capacitor trench 45. The etch process may be an anisotropic etch, such as reactive ion etch (RIE). Other anisotropic etch processes that are suitable for forming the contact trench 35, isolation trench 40 and the capacitor trench 45 include ion beam etching, plasma etching or laser ablation.

The etch process for forming the contact trench 35, isolation trench 40 and the capacitor trench 45 into the semiconductor on insulator (SOI) substrate 5 may be a multi-stage etch. For example, during the first stage of the etch process, the portions of the upper semiconductor layer 25 that are exposed by the etch mask may be etched using an etch chemistry that is selective to the underlying dielectric layer 20. Thereafter, the exposed portions of the dielectric layer 20 may be etched using an etch chemistry that is selective to the epitaxially formed semiconductor layer 15. In a final stage of the etch process, the epitaxially formed semiconductor layer 15 is etched, wherein depending upon the final depth of the trench being formed, the etch may continue into the base semiconductor layer 10.

The contact trench 35, isolation trench 40 and the capacitor trench 45 may be formed simultaneously using the same etch mask, i.e., a single etch mask is used to form each of the contact trench 35, isolation trench 40 and the capacitor trench 45. By "simultaneously" it is meant that each of the trenches are formed at the same time, each trench being subjected to the same etch chemistries and the same etch mask.

The capacitor trench 45 has a first depth D1, the contact trench 35 has a second depth D2, and the isolation trench 40 has a third width D3, wherein the third depth D3 is greater than the second depth D2 and the second depth D2 is greater than the first depth D1. The first depth D1 of the capacitor trench 45 may range from 1 μm to 8 μm, as measured from the upper surface of the upper semiconductor layer 25. In another embodiment, the first depth D1 of the capacitor trench 45 may range from 2 μm to 4 μm. The second depth D2 of the contact trench 35 may range from 3 μm to 10 μm. In another embodiment, the second depth D2 of the contact trench 35 may range from 5 μm to 8 μm. In one embodiment, the sidewall of the capacitor trench 45 may include a taper through the entire depth of the trench beginning from the surface of the semiconductor on insulator (SOI) substrate 5 resulting in a trapezoidal geometry.

The contact trench 35 and the isolation trench 40 are both etched to a depth that contacts the base semiconductor layer 10. The capacitor trench 45 is etched to a depth that terminates in the epitaxially grown semiconductor layer 15. In some embodiments, the depth of the contact trench 35, the isolation trench 40 and the capacitor trench 45 is related to the width of the opening in the etch mask that corresponds to the contact trench 35, isolation trench 40 and the capacitor trench 45. More specifically, as the width of the opening in the etch mask is increased, the etch rate of the exposed portions of semiconductor on insulator substrate (SOI) 5 increases. The etch rate increases within increased trench width, because the greater width allows for a greater amount of etchant to reach the surface to be etched than the narrower trench widths. Therefore, the etch process that simultaneously forms the contact trench 35, the isolation trench 40, and the capacitor trench 45, etches the contact trench 35 and the isolation trench 40 to greater depths than the capacitor trench 45.

In one embodiment, the simultaneous anisotropic etch that provides the contact trench 35, isolation trench 40 and the capacitor trench 45 relies on aspect ratio dependent etching (ARDE) or RIE lag, where the etch rate is dependent on the dimensions of the trench opening, i.e., smaller trenches etch at a lower rate than larger trenches. In order to promote the directional etch, the etch is designed to facilitate an inhibitor film formation on the sidewall that helps maintain the trench profile and prevent ballooning. This inhibitor film tends to limit available etchant and reaction area to slow down the etch rate and eventually pinch off the smaller trenches earlier than the larger trenches. Additionally, incoming etchant ions have an angular distribution that will lead to a portion of the incoming ions to be captured by the sidewall. In a smaller trench, this ion depletion effect is much more pronounced than in a larger trench, thus reducing the etch rate of smaller trenches. Additionally, etchant ions are consumed by the etching and by-products are produced. So new etchant ions need to be replenished and the by-products need to be removed before further etching can take place. The transport of etchant ions and by-products are obviously more efficient in a larger opening, leading to ARDE. By properly designing the trench opening sizes W1, W2, and W3, the desired trench depths can be achieved for contact trench 35, isolation trench 40 and the capacitor trench 45 using the same anisotropic etch process.

A conformal dielectric layer 50 may then be formed in the contact trench 35, the isolation trench 40 and the capacitor trench 45. The term "conformal" denotes a layer having a thickness that does not deviate from greater than or less than 20% of an average value for the thickness of the layer. The conformal dielectric layer 50 may be composed of any dielectric material. For example, the conformal dielectric layer 50 employed at this stage may be any dielectric material including, but not limited to silicon nitride, silicon oxide, aluminum oxide, zirconium oxide, and hafnium oxide or a combination of dielectric materials. The conformal dielectric layer 50 may be deposited on the sidewall and base portions of the contact trench 35, the isolation trench 40 and the capacitor trench 45. The conformal dielectric layer 50 may be simultaneously formed on each of the contact trench 35, the isolation trench 40 and the capacitor trench 45 using a blanket deposition. In one embodiment, the conformal dielectric layer 50 may be deposited using chemical vapor deposition (CVD) and/or atomic layer deposition (ALD). In another embodiment, the conformal dielectric layer 50 is formed using a growth process, such as thermal oxidation. In one embodiment, the conformal dielectric layer 50 may have a thickness of from 4.0 nm to 10.0 nm. In another embodiment, the conformal dielectric layer of the conformal dielectric layer 50 may have a thickness of from 2.5 nm to 7.0 nm, with a thickness of from 3.0 nm to 5.0 nm being more typical.

Figure 2:
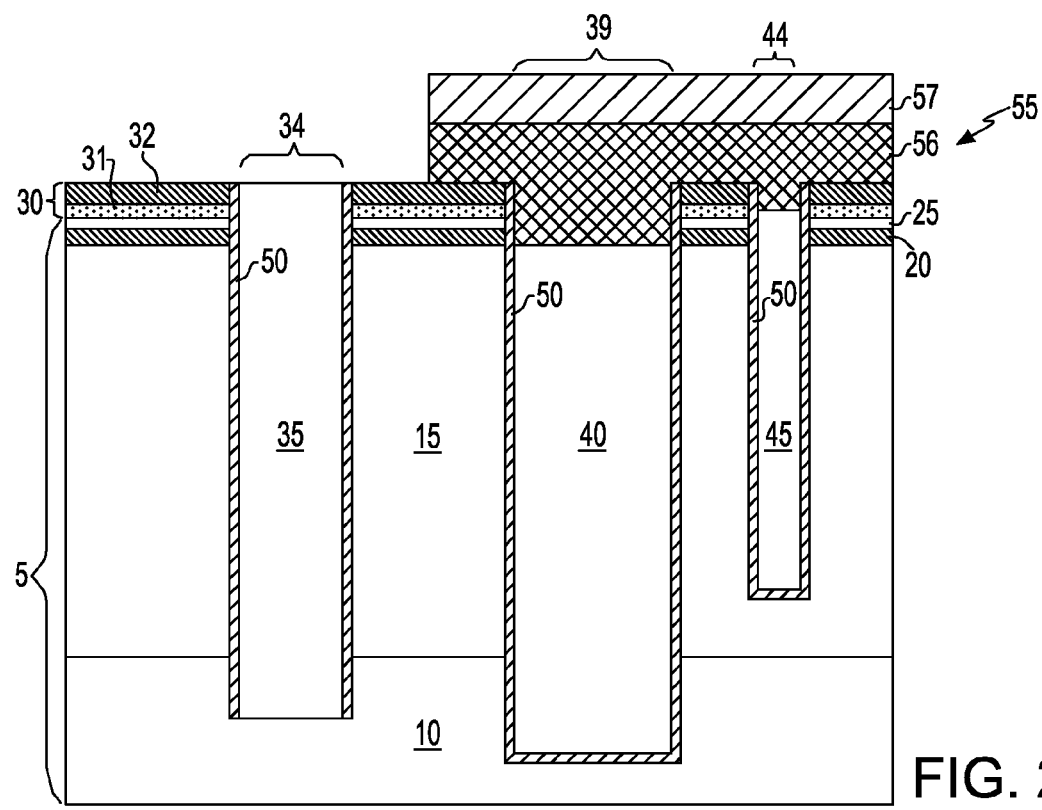
FIG. 2 is a side cross-sectional view depicting forming a block mask over an isolation trench and a capacitor trench, in accordance with one embodiment of the present disclosure.

FIG. 2 depicts one embodiment of forming a block mask 55 over the isolation trench 40 and a capacitor trench 45, and removing the conformal dielectric layer 50 from the base portion of the contact trench 35. In one embodiment, the block mask 55 is formed by a non-conformally deposited material layer 56 that is formed over the capacitor trench 45, the isolation trench 40. In one embodiment, the non-conformally deposited material layer 56 is blanket deposited over the capacitor trench 45, the isolation trench 40 and the contact trench 35, and is then removed from the contact trench 35 using photolithography and etching. The non-conformal dielectric layer 56 that is deposited over the capacitor trench 45, the isolation trench 40 and the contact trench 35 does not fill the trenches. The non-conformal dielectric layer 56 caps the capacitor trench 45, the isolation trench 40 and the contact trench 35 by bridging across the contact opening 34, the isolation opening 39 and the capacitor opening 44. Illustrative examples of suitable materials for the non-conformal dielectric layer 56 include, but are not limited to, $SiO_2$, boron phosphor silicate glass (BPSG) oxide, fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H. In one embodiment, the non-conformal dielectric layer 56 is composed of silicon oxide ($SiO_2$) that is deposited by high density plasma chemical vapor deposition (HDPCVD).

A photoresist mask 57 can be produced by applying a photoresist layer to the surface of the non-conformal dielectric layer 56, exposing the photoresist layer to a pattern of radiation, and then developing the pattern into the photoresist layer utilizing resist developer. The remaining portion of the photoresist layer provides the photoresist mask 57 and remains over the non-conformal dielectric layer 56 that is overlying the isolation trench 40 and the capacitor trench 45.

Alternatively, a hardmask may be substituted for the photoresist mask 57. Hardmask materials include dielectric systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to, silsequioxanes, siloxanes, and boron phosphate silicate glass (BPSG). A block mask comprising a hardmask material may be formed by blanket depositing a layer of hardmask material, providing a patterned photoresist atop the layer of hardmask material, and then etching the layer of hardmask material to provide a block mask (not shown) protecting the portion of the non-conformal dielectric layer 56 that is overlying the isolation trench 40 and the capacitor trench 45.

A selective etch process may remove the exposed portion of the non-conformal dielectric layer 56 that is present over the contact trench 35, while the portion of the non-conformal dielectric layer 56 that is present over the isolation trench 40 and the capacitor trench 45 is protected by the photoresist mask 57. The selective etch process may remove the exposed portion of the non-conformal dielectric layer 56 without etching the hard mask dielectric layer 32. The selective etch process may be an anisotropic etch, such as reactive ion etch.

Still referring to FIG. 2, following removal of the non-conformal dielectric layer 56 from the contact trench 35, the portion of the conformal dielectric layer 50 that is present at the base of the contact trench 35 is removed to expose the base semiconductor layer 10. The portion of the conformal dielectric layer 50 that is present at the base of the contact trench 35 may be removed using an anisotropic etch, such as reactive ion etch (RIE). The anisotropic etch that removes the portion of the conformal dielectric layer 50 that is present at the base of the contact trench 35 may also be provided by ion beam etching, plasma etching or laser ablation.

Figure 3:
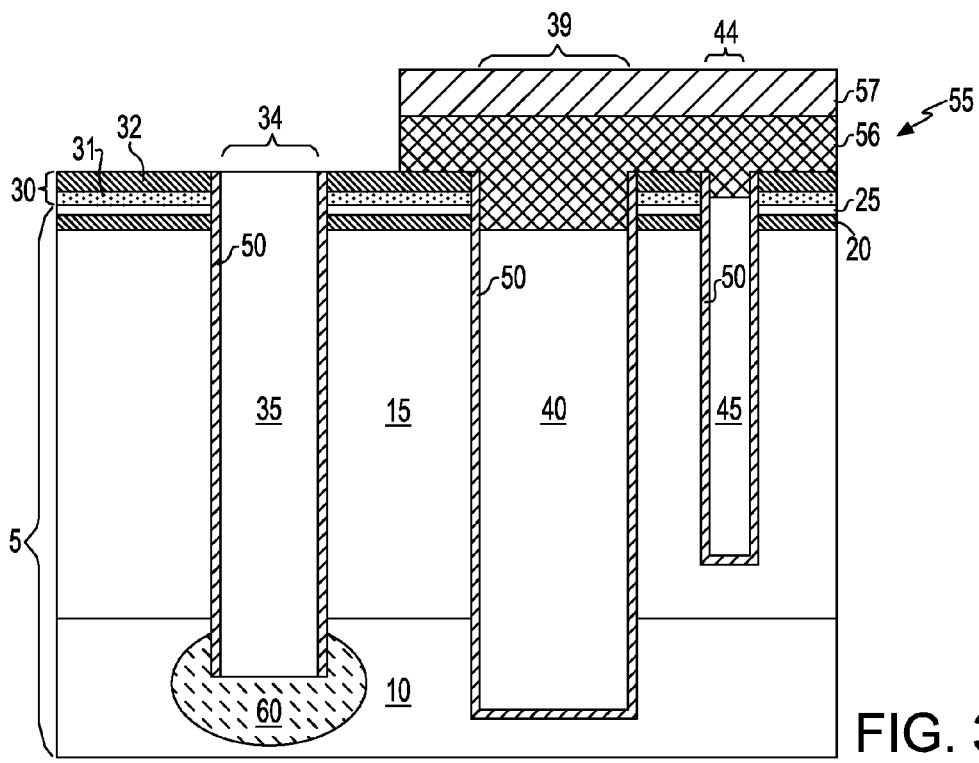
FIG. 3 is a side cross-sectional view depicting forming a dopant region in the base semiconductor layer at the base portion of the contact trench, in accordance with one embodiment of the present disclosure.

FIG. 3 depicts forming a dopant region 60 in the base semiconductor layer 10 at the base portion of the contact trench 35. In one embodiment, the dopant region 60 is formed by ion implanting a p-type dopant into the base semiconductor layer 10. As used herein, "p-type" refers to the addition of trivalent impurities to a semiconductor material that create deficiencies of valence electrons. The p-type conductivity dopant region 60 is produced within Si-containing substrates by doping the base semiconductor layer 10 with elements from group III-A of the Periodic Table of Elements. In one embodiment, a p-type dopant region 60 is formed by implanting dopants of at least one of boron, aluminum or gallium into the base surface of the contact trench 35 in the base semiconductor layer 10.

In one embodiment, the p-type dopant may be ion implanted into the dopant region 60 using an energy of 0.5 keV to 15.0 keV with a dose of $1\times10^{13}$ atoms/cm$^2$ to $1\times10^{16}$ atoms/cm$^2$. In another embodiment, the p-type dopant may be ion implanted into the dopant region 60 with using an energy of 1 keV to 5 keV with a dose of $3\times10^{14}$ atoms/cm$^2$ to $3\times10^{15}$ atoms/cm$^2$.

The concentration of the p-type dopant that is present in the dopant region 60 is greater than $1\times10^{17}$ atoms/cm$^3$. In one embodiment, the concentration of the p-type dopant that is present in the dopant region 60 ranges from $1\times10^{17}$ atoms/cm$^3$ to $5\times10^{21}$ atoms/cm$^3$. In another embodiment, the concentration of the p-type dopant that is present in the dopant region 60 ranges from $1\times10^{19}$ atoms/cm$^3$ to $5\times10^{20}$ atoms/cm$^3$.

Figure 4:
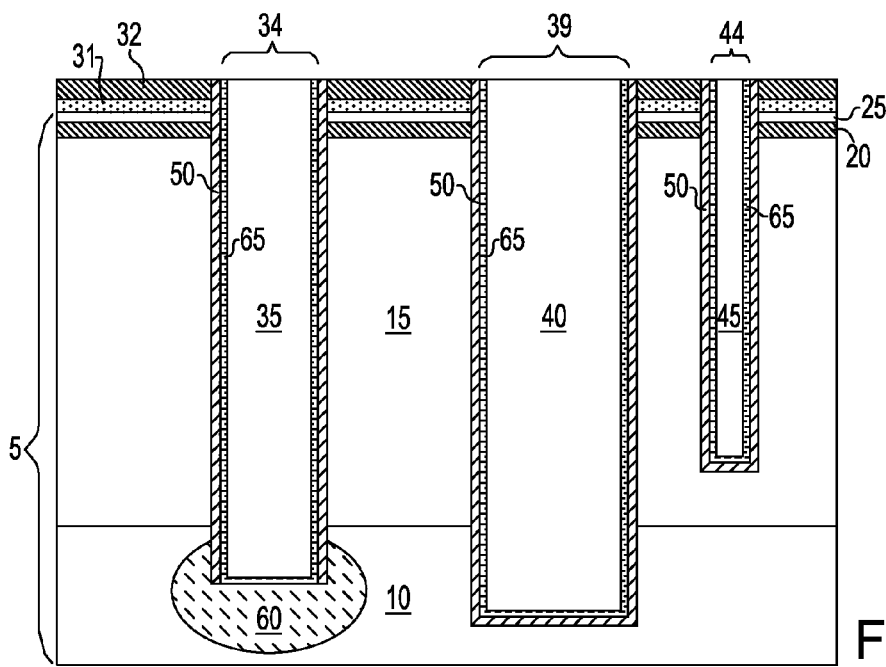
FIGS. 4 and 5 are side cross-sectional views depicting filling the contact trench, the isolation trench and the capacitor trench with a conductive material, in accordance with one embodiment of the present disclosure.

The block mask 55 may be removed and a metal nitride layer 65 may be deposited on the sidewalls and base surfaces of the contact trench 35, the isolation trench 40 and the capacitor trench 45 as depicted in FIG. 4. The block mask 55 may be removed using chemical stripping, oxygen ashing, selective etching, or planarization, e.g., chemical mechanical planarization (CMP).

The metal nitride layer 65 that is present in the contact trench 35, the isolation trench 40 and the capacitor trench 45 may be composed of titanium nitride (TiN), tantalum nitride (TaN), tantalum silicon nitride (TaSiN), tungsten nitride (WN) or a combination thereof. In one embodiment, the metal nitride layer 65 may have a thickness ranging from 25 Å to 200 Å. In another embodiment, the metal nitride layer 65 has a thickness ranging from 50 Å to 100 Å.

In one embodiment, the metal nitride layer 65 is deposited using a conformal deposition method. The metal nitride layer 65 may be deposited using a physical vapor deposition (PVD) method, such as sputtering. In one embodiment, the sputtering deposition process for forming the metal nitride layer 65 includes applying high-energy particles to strike a solid slab of a metal target material to provide the metal constituent of the metal nitride layer 65, such as titanium. The high-energy particles physically dislodge metal atoms of target material, which are then deposited on the sidewalls and base surfaces of the contact trench 35, the isolation trench 40 and the capacitor trench 45. The source of nitrogen for the metal nitride layer 65 may be provided by nitrogen gas ($N_2$). The nitrogen source may be introduced to the sputtering chamber as the sputtered atoms of the metal constituent of the metal nitride layer 65 are migrating towards the deposition surface.

Figure 5:
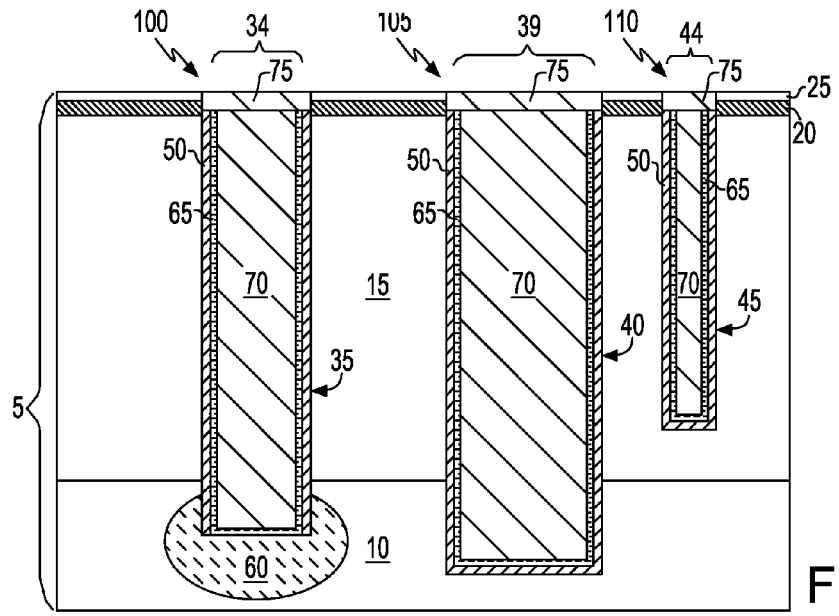

FIG. 5 depicts one embodiment of filling the contact trench 35, the isolation trench 40 and the capacitor trench 45 with a conductive material 70. The conductive material 70 may be a doped semiconductor, such as doped polysilicon, or a metal. In the embodiments in which the conductive material is provided by doped polysilicon, the dopant may be an n-type or p-type dopant having a dopant concentration ranging from $1\times10^{18}$ atoms/cm$^3$ to $1\times10^{20}$ atoms/cm$^3$. The conductive material 70 may be deposited using physical vapor deposition (PVD), such as plating or sputtering, or may be deposited using chemical vapor deposition (CVD).

The pad dielectric stack 30 may be removed using a planarization process. Planarization is a material removal process that employs at least mechanical forces, such as frictional media, to produce a planar surface. One example of a planarization method that is suitable for removing the pad dielectric stack is chemical mechanical planarization (CMP). Chemical mechanical planarization (CMP) is a material removal process using both chemical reactions and mechanical forces to remove material and planarize a surface.

In one embodiment, the metal nitride layer 65, the conformal dielectric layer 50, and the conductive material 70 that is present within the contact trench 35, the isolation trench 40 and the capacitor trench 45 is recessed using an anisotrpic etch, such as reactive ion etch (RIE). The recessed portion of the conformal dielectric layer 50, and the conductive material 70 does not extend into the epitaxially grown semiconductor layer 15. The recessed portion of the conformal dielectric layer 50, and the conductive material 70 may then be filled with a conductive material to provide a contact 75 to the conductive material 70. This process allows the capacitor trench 45 to be connected with the upper semiconductor layer 25 in a DRAM application. In another embodiment where DRAM is not present, the recess process may be skipped and material 70 forms the trench fill as well as the top contact to trench fill. In some embodiments, the contact 75 is composed of metal semiconductor alloy, such as a silicide. Silicide formation typically requires depositing a refractory metal, such as Ni or Ti, onto the surface of a Si-containing material, such as a conductive fill composed of doped polysilicon. Following deposition, the structure is then subjected to an annealing step including, but not limited to, rapid thermal annealing. During thermal annealing, the deposited metal reacts with Si forming a metal silicide.

The structures contained within the contact trench 35 provide a substrate contact 100. The substrate contact 100 extends from the upper semiconductor layer 25 through the dielectric layer 20 and the n-type epitaxially grown semiconductor layer 15 to a p-type doped region 60 of the base semiconductor layer 10. The substrate contact 100 substantially suppresses the potential fluctuation and noise in the base semiconductor layer 10, since the base semiconductor layer 10 can be electrically tied to a fixed potential such as, but not limited to ground at desirable frequency.

The structures contained within the capacitor trench 45 provide a capacitor 110. The capacitor 110 extends from the upper semiconductor layer 25 through the dielectric layer 20 into contact with the n-type epitaxially grown semiconductor layer 15. The capacitor 110 is not in direct contact with the base semiconductor layer 10. A "capacitor" is a structure including two electrically conductive materials separated and insulated from each other by a dielectric for storing a charge. The term "electrode" as used to describe a component of the capacitor 110 represents one of at least two electrically conductive materials of the capacitor 110 that are separated by a node dielectric layer. The electrodes of the capacitor 110 are provided by the metal nitride layer 65, the conductive fill material 70, and the portion of the n-type semiconductor layer 15 that is adjacent to the capacitor trench 44. The metal nitride layer 65 and the conductive fill material 70 provide the upper electrode of the capacitor 110. The portion of the n-type semiconductor layer 15 that is adjacent to the capacitor trench 44 provides the lower electrode of the capacitor 110. The "node dielectric layer" is the dielectric layer that is present between the electrodes of the capacitor 110. The node dielectric layer of the capacitor 110 depicted in FIG. 5 is provided by the non-conformal dielectric layer 50.

The structures contained in the isolation trench 40 provide an electrical isolation region 105 to isolate region the n-type epitaxially grown semiconductor layer 15 that is surrounding capacitor trench 44 from n-type epitaxially grown semiconductor layer 15 that is surrounding substrate contact trench 34. A parasitic U-shaped MOSFET is formed where the two regions of n-type epitaxially grown semiconductor layer 15 function as the source and drain, the conformal dielectric layer 50 functions as a gate dielectric and a gate conductor is provided by the metal nitride layer 65 and the conductive fill 70. The portion of the isolation trench in the base semiconductor layer 10 defines the channel length and a low bias, such as ground, on the isolation trench conductive fill 70 can effectively turn this parasitic MOSFET off and provide isolation. In one embodiment, the isolation trench 39 needs to form an enclosed area to cut off all leakage paths.

Figure 6:
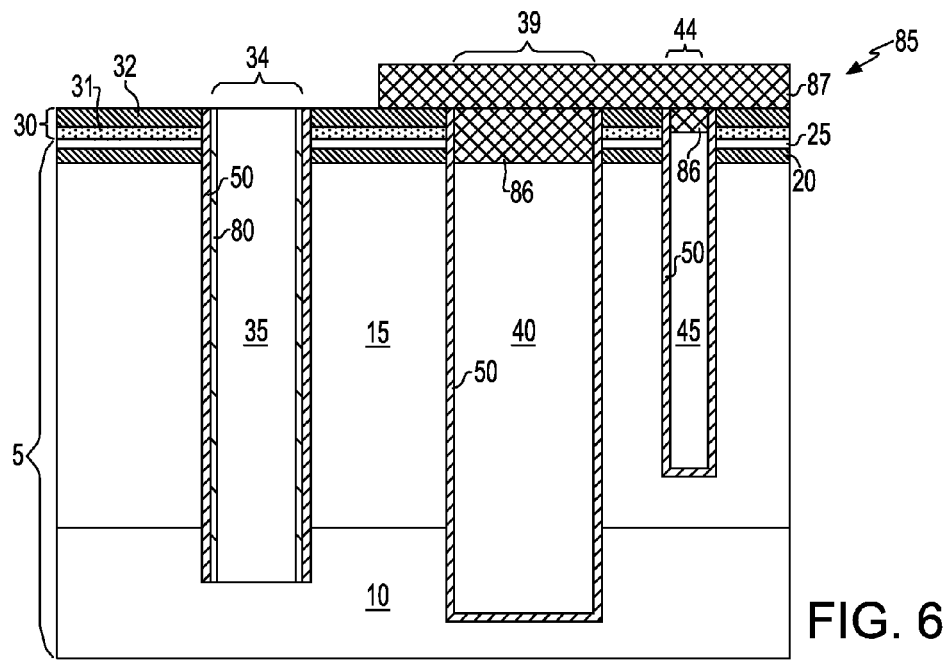
FIG. 6 is a side cross-sectional view of forming a conformal metal layer within the contact trench that is depicted in FIG. 2, in accordance with another embodiment in the present disclosure.

FIG. 6 depicts another embodiment of the present disclosure, in which a protective metal layer 80 is formed on the conformal dielectric layer 50 within the contact trench 35 prior to forming the dopant region 60. The protective metal layer 80 protects the conformal dielectric layer 50 during the processes that expose the base semiconductor layer 10 at the base portion of the contact trench 35 prior to ion implantation to form the dopant region 60. The protective metal layer 80 is deposited after the conformal dielectric layer 50 has been formed in the contact trench 35, the isolation trench 40 and the capacitor trench 45, as depicted in FIG. 1. Before depositing the protective metal layer 80, a block mask 85 is formed over the isolation trench 40 and the capacitor trench 45, wherein the contact trench 35 remains exposed. The block mask 85 is similar to the block mask 55 that is described with reference to FIG. 2. In one embodiment, a non-conformally deposited material layer 86 is formed over the capacitor trench 45 and the isolation trench 40. In one embodiment, the non-conformally deposited material layer 86 is blanket deposited over the capacitor trench 45, the isolation trench 40 and the contact trench 35, and is then removed from the contact trench 35 using photolithography and etching, as depicted in FIG. 6.

The non-conformal dielectric layer 86 that is deposited over the capacitor trench 45, the isolation trench 40 and the contact trench 35 does not fill the trenches. The non-conformal dielectric layer 86 caps the capacitor trench 45, the isolation trench 40 and the contact trench 35 by bridging across the contact opening 34, the isolation opening 39 and the capacitor opening 44. Illustrative examples of suitable materials for the non-conformal dielectric layer 86 include, but are not limited to, $SiO_2$, boron phosphor silicate glass (BPSG) oxide, fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H. In one embodiment, the non-conformal dielectric layer 86 is composed of silicon oxide ($SiO_2$) that is deposited by high density plasma chemical vapor deposition (HDPCVD).

A photoresist mask 87 can be produced by applying a photoresist layer to the surface of the non-conformal dielectric layer 86, exposing the photoresist layer to a pattern of radiation, and then developing the pattern into the photoresist layer utilizing resist developer. The remaining portion of the photoresist layer remains over the non-conformal dielectric layer 86 that is overlying the isolation trench 40 and the capacitor trench 45. A selective etch process may remove the exposed portion of the non-conformal dielectric layer 86 that is present over the contact trench 35, while the portion of the non-conformal dielectric layer 86 that is present over the isolation trench 40 and the capacitor trench 45 is protected by the photoresist mask 87. The selective etch process may be an anisotropic etch, such as reactive ion etch.

Still referring to FIG. 6, the protective metal layer 80 may be formed within the contract trench 34 and is obstructed from being formed in the isolation trench 40 and the capacitor trench 45 by the block mask 85. The protective metal layer 80 may be composed of titanium nitride (TiN), tantalum nitride (TaN), tantalum silicon nitride (TaSiN), tungsten nitride (WN) or a combination thereof.

The protective metal layer 80 is a conformally deposited layer. The protective metal layer 80 may be deposited using physical vapor deposition (PVD), such as sputtering. In one embodiment, the protective metal layer 80 may have a thickness ranging from 25 Å to 200 Å. In another embodiment, the protective metal layer 80 has a thickness ranging from 50 Å to 100 Å.

Following deposition of the protective metal layer 80, an anisotropic etch may remove the horizontal surfaces of the protective metal layer 80. For example, the portions of the protective metal layer 80 that are present on the pad dielectric stack 30 and the base of the contact trench 35 may be removed by reactive ion etch. In one embodiment, the etch process that removes the horizontal portions of the protective metal layer 80 is selective to the conformal dielectric layer 50. Once the protective metal layer 80 that is present at the base portion of the contact trench 35 is removed, the portion of the conformal dielectric layer 50 that is present at the base portion of the contact trench 35 is removed to expose the underlying base semiconductor layer 10. The exposed portion of the conformal dielectric layer 50 may be removed using an anisotropic etch that is selective to the base semiconductor layer 10, such as reactive ion etch (RIE). The anisotropic etch that removes the exposed portion of the conformal dielectric layer 50 that is present at the base of the contact trench 35 may also be provided by ion beam etching, plasma etching or laser ablation.

Figure 7:
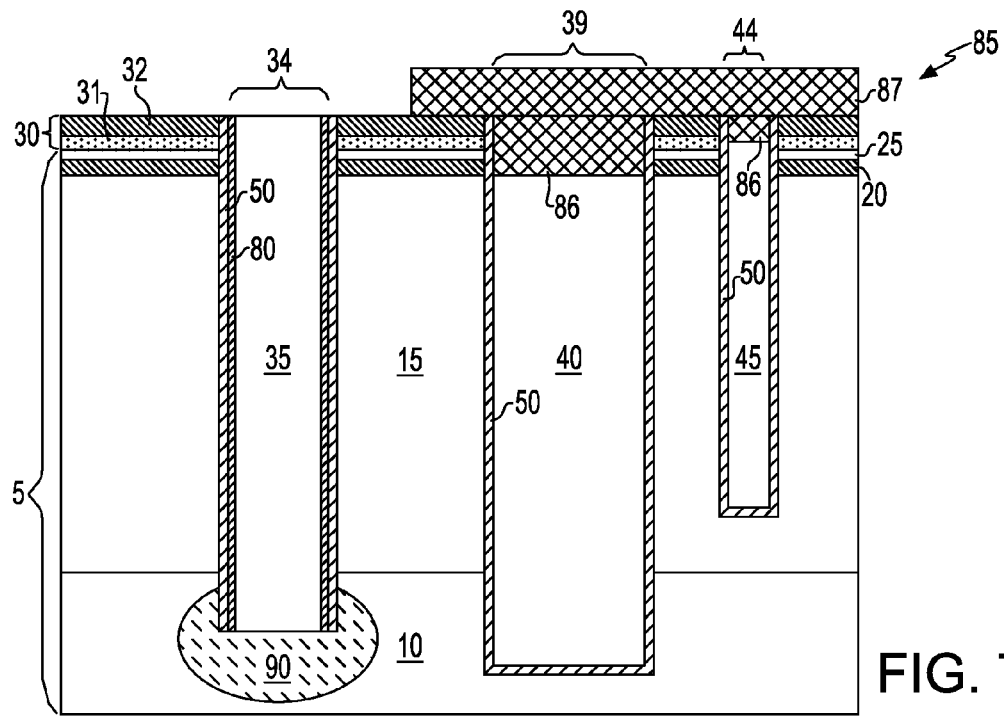
FIG. 7 is a side cross-sectional view depicting one embodiment of forming a dopant region in the base semiconductor layer at the base portion of the contact trench that is depicted in FIG. 6.

FIG. 7 depicts forming a dopant region 90 in the base semiconductor layer 10 at the base portion of the contact trench 35. The dopant region 90 that is depicted in FIG. 7 is similar to the dopant region 60 that is described above with reference to FIG. 4. Therefore, the description of the composition and method of forming the dopant region 60 that is depicted in FIG. 4 is suitable for forming the dopant region 90 that is depicted in FIG. 7.

Figure 8:
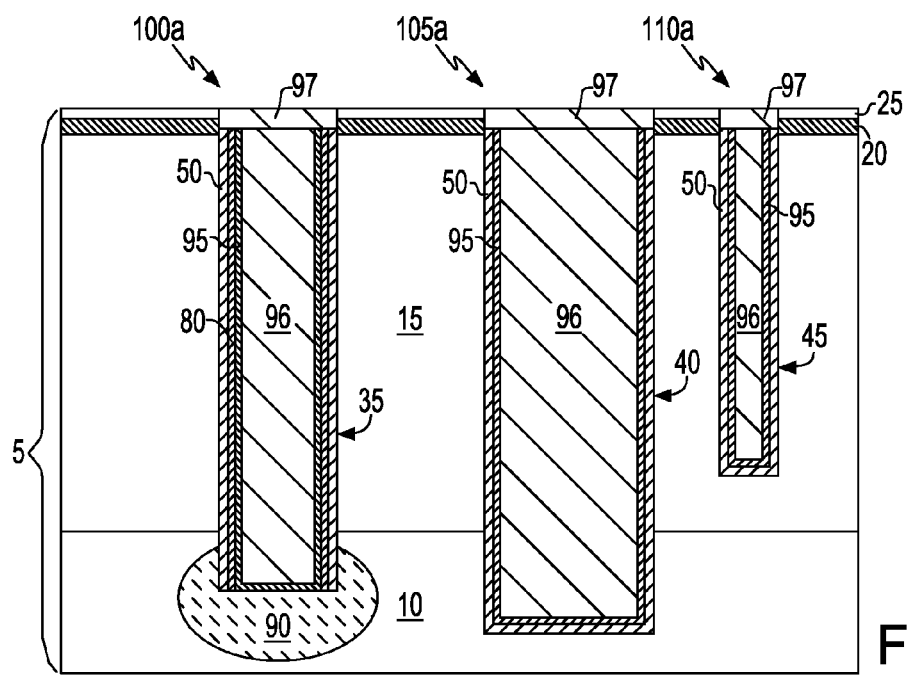
FIG. 8 is a side-cross sectional view depicting filling the contact trench, the isolation trench and the capacitor trench that are depicted in FIG. 7 with at least one conductive material, in accordance with one embodiment of the present disclosure.

FIG. 8 depicts one embodiment of filling the contact trench 35, the isolation trench 40 and the capacitor trenches 45 that are depicted in FIG. 7 with a metal nitride layer 95 and a conductive fill material 96. In the embodiment that is depicted in FIG. 8, the metal nitride layer 95 is present in direct contact with the protective metal layer 80 on the sidewalls of the contact trench 35 and is present on the exposed portion of base semiconductor layer 10 at the base portion of the contact trench 35. The metal nitride layer 95 and the conductive fill material 96 that are depicted in FIG. 8 are similar to the metal nitride layer 65 and the conductive fill material 70 that are depicted in FIG. 5. Therefore, the description of the composition and method of forming the metal nitride layer 65 and the conductive fill material 70 that is depicted in FIG. 5 is suitable for forming the metal nitride layer 95 and the conductive fill material 96 that is depicted in FIG. 8.

FIG. 8 also depicts forming contacts 97 composed of metal semiconductor material to at least the conductive fill material 96. The contacts 97 that are depicted in FIG. 8 are similar to the contacts 75 that are depicted in FIG. 5. Therefore, the description of the composition and method of forming the contacts 75 that are depicted in FIG. 5 is suitable for forming the contacts 97 that are depicted in FIG. 8.

The substrate contact 100a that is depicted in FIG. 8 is similar to the substrate contact 100 that is depicted in FIG. 5, but further includes a layer of protective metal, i.e., protective metal layer 80 that is present on the sidewall portions of the conformal dielectric layer 50 that is contained within the contact trench 35. The protective metal layer 80 protects the conformal dielectric layer 50 that is present on the sidewalls of the contact trench 35 during the etch process sequence that exposes the portion of the base semiconductor layer 10 that is implanted to provide the dopant region 90 of the substrate contact 100a. The electrical isolation region 105a and the capacitor 110a that are depicted in FIG. 8 may be identical to the electrical isolation region 105 and the capacitor 110 that are depicted in FIG. 5.

Figure 9:
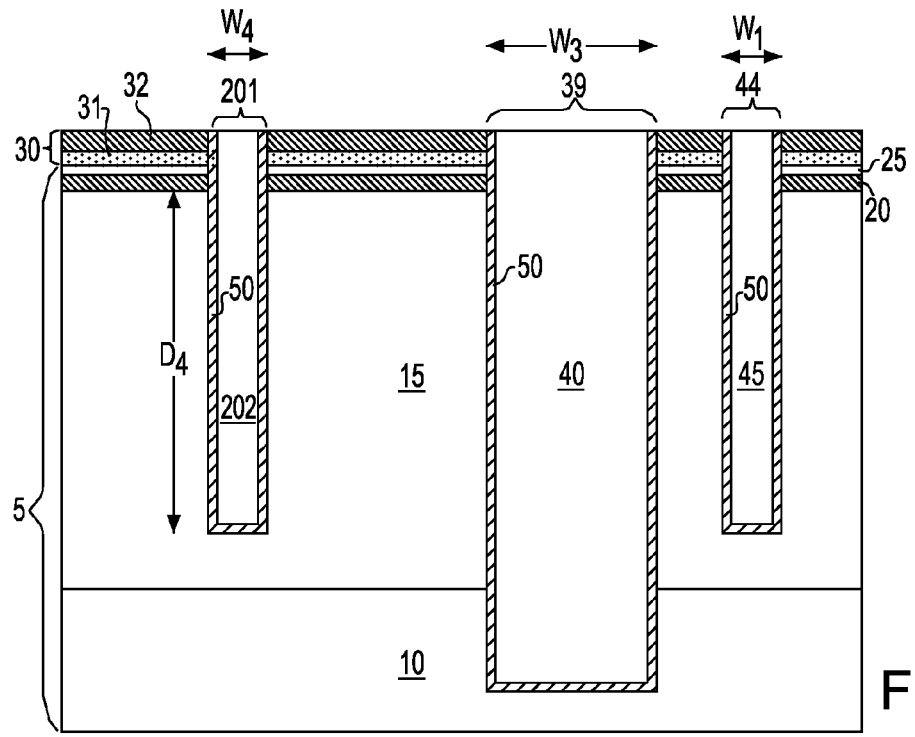
FIG. 9 is a side cross-sectional view of an initial structure used in one embodiment of a method of forming a contact to a semiconductor structure, in which the initial structure has been etched to provide a contact trench into contact with an epitaxially grown semiconductor layer, an isolation trench into contact with the base semiconductor layer, and a capacitor trench having a base portion present in the epitaxially grown semiconductor layer, in accordance with the present disclosure.
Figure 10:
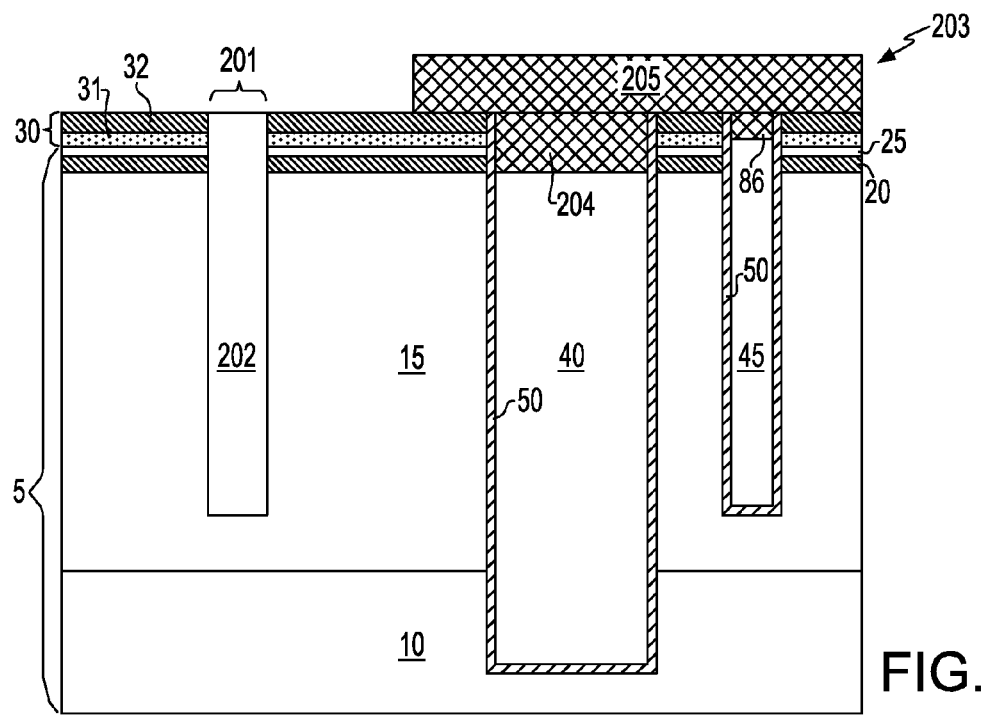
FIG. 10 is a side cross-sectional view of removing a conformal dielectric layer from the contact trench that is depicted in FIG. 9, in accordance with one embodiment of the present disclosure.
Figure 11:
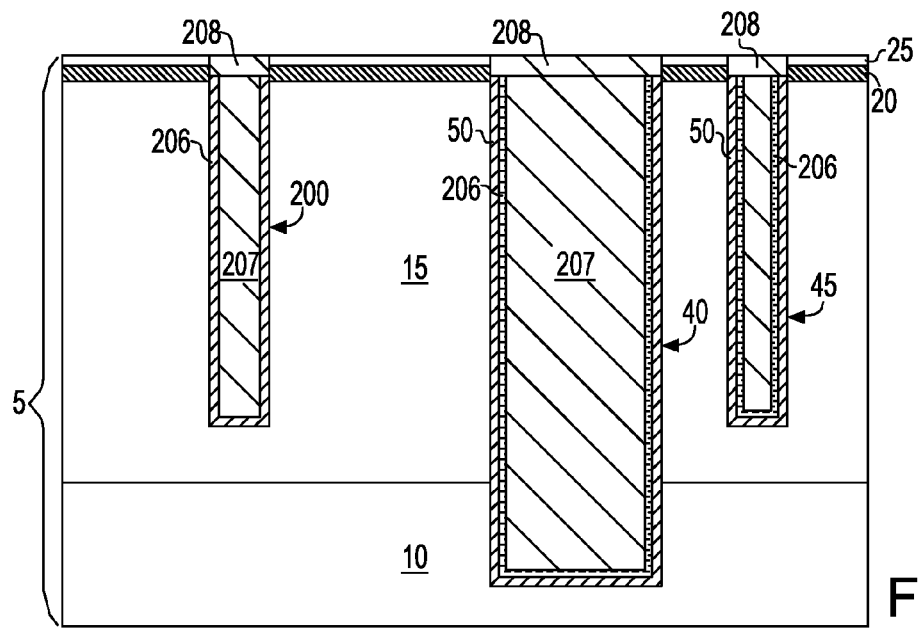
FIG. 11 is a side-cross sectional view depicting filling the contact trench, the isolation trench and the capacitor trenches that are depicted in FIG. 10 with at least one conductive material, in accordance with one embodiment of the present disclosure.

FIGS. 9-11 depict one embodiment of forming a contact 200 to the n-type epitaxially grown semiconductor layer 15, i.e., n-type epitaxially grown semiconductor layer 15. The method that is depicted in FIGS. 9-11 may be practiced in combination with or separately from the methods and structures disclosed in FIGS. 1-8. FIG. 9 depicts a substrate 5 that has been etched to provide a contact trench 202 into contact with an epitaxially grown semiconductor layer 15, an isolation trench 40 into contact with the base semiconductor layer 10, and a capacitor trench 45 having a base portion present in the epitaxially grown semiconductor layer 15. The capacitor trench 45 and the isolation trench 40 are similar to the capacitor trench 45 and the isolation trench 40 that are depicted in FIG. 1. The contact trench 202 to the epitaxially grown semiconductor layer 15 that is depicted in FIG. 9 is differentiated from the contact trench 35 that is depicted in FIG. 1, because the contact trench 202 to the epitaxially grown semiconductor layer 15 is not in direct contact with the base semiconductor layer 10. Referring to FIGS. 1 and 9, the contact trench 202 to the epitaxially grown semiconductor layer 15 typically has a width W4 that is less than the width W2 of the contact trench 35 to the base semiconductor layer 10. As indicated above, the depth of the trenches may be dependent upon the width of the opening in the etch mask that provides the trenches. Because the contact trench 202 to the epitaxially grown semiconductor layer 15 does not extend to the base semiconductor layer 10, the width W4 of the contact trench 202 may be similar to the width W1 of the capacitor trench 45, wherein the capacitor trench 45 also does not reach the base semiconductor layer 10. The width W4 of the contact trench 202 to the epitaxially grown semiconductor layer 15 is typically less than the width W3 of the isolation trench 40.

In one embodiment, the contact trench 202 to the epitaxially grown semiconductor layer 15 has a width W4 ranging from 0.04 μm to 0.3 μm. In another embodiment, the contact trench 202 has a width W4 ranging from 0.06 μm to 0.1 μm. In one embodiment, the depth D4 of the contact trench 202 to the epitaxially grown semiconductor layer 15 ranges from 1 μm to 8 μm. In another embodiment, the depth D4 of the contact trench 202 to the epitaxially grown semiconductor layer 15 ranges from 2 μm to 4 μm. With the exceptions of the dimensions of the contact trench 202, the contact trench 202 to the epitaxially grown semiconductor layer 15, the isolation trench 40 and the capacitor trench 45 are formed using methods and structures similar to those described above with reference to FIG. 1.

FIG. 9 further depicts forming a conformal dielectric layer 50 on the sidewall and base portions of the contact trench 202 to the epitaxially grown semiconductor layer 15, the isolation trench 40 and the capacitor trench 45. The conformal dielectric layer 50 that is depicted in FIG. 9 is similar to the conformal dielectric layer 50 that is described above with reference to FIG. 1.

FIG. 10 depicts one embodiment of removing the conformal dielectric layer 50 from the contact trench 202 to the epitaxially grown semiconductor layer 15. The conformal dielectric layer 50 remains within the isolation trench 40 and the capacitor trench 45. In one embodiment, prior to removing the conformal dielectric layer 50 from the contact trench 202, an etch mask 203 is formed over the isolation trench 40 and the capacitor trench 45, wherein the contact trench 202 to the epitaxially grown semiconductor layer 15 is exposed. The etch mask 203 may be formed from a non-conformally deposited layer 204 to enclose the isolation trench 40 and the capacitor trench 45 in combination with a photoresist mask 205 using deposition, photolithography and etch processes. The etch mask 203, the non-conformally deposited layer 204 and the photoresist mask 205 that are depicted in FIG. 10 are similar to the block mask 85 that includes the non-conformally deposited material layer 86 and the photoresist mask 87 that is described above with reference to FIG. 6. Therefore, the description of the composition and method of forming the block mask 85 that is depicted in FIG. 6 is suitable for the etch mask 203 that is depicted in FIG. 10.

In one embodiment, following the formation of the etch mask 203, the conformal dielectric layer 50 is removed from the contact trench 202 to the epitaxially grown semiconductor layer 15. The conformal dielectric layer 50 may be removed using an anisotropic or isotropic etch that is selective to the epitaxially grown semiconductor layer 15. In one embodiment, the conformal dielectric layer 50 may be removed from the contact trench 202 using a reactive ion etch (RIE).

FIG. 11 depicts filling the contact trench 202, the isolation trench 40 and the capacitor trench 45 with at least one conductive material. In one embodiment, a metal nitride layer 206 is formed in each of the contact trench 202, the isolation trench 40 and the capacitor trench 45. The metal nitride layer 206 is formed in direct contact with the epitaxially grown semiconductor layer 15 that provides the base and sidewall surfaces of the contact trench 202. The metal nitride layer 206 is formed in direct contact with the conformal dielectric layer 50 in the isolation trench 40 and the capacitor trench 45. A conductive fill material 207 is formed in direct contact with the metal nitride layer 206. The conductive fill natural 207 fills each of the contact trench 202, the capacitor trench 45 and the isolation trench 40.

The metal nitride layer 206 and the conductive fill material 207 that are depicted in FIG. 11 are similar to the metal nitride layer 65 and the conductive fill material 70 that are depicted in FIG. 5. Therefore, the description of the composition and method of forming the metal nitride layer 65 and the conductive fill material 70 that is depicted in FIG. 5 is suitable for forming the metal nitride layer 206 and the conductive fill material 207 that is depicted in FIG. 11. It should be pointed out that the embodiment is exemplary and for those skillful in the art, by using the block mask scheme described before, if the process sequence is adjusted and if different materials are used, other embodiments can be easily achieved such as an embodiment with the conductive fill material 207 directly in contact with epitaxially grown semiconductor layer 15 of the substrate, thus eliminating any Schottky barrier that may possibly exist between contact trench 202 and the epitaxially grown semiconductor layer 15.

Figure 16:
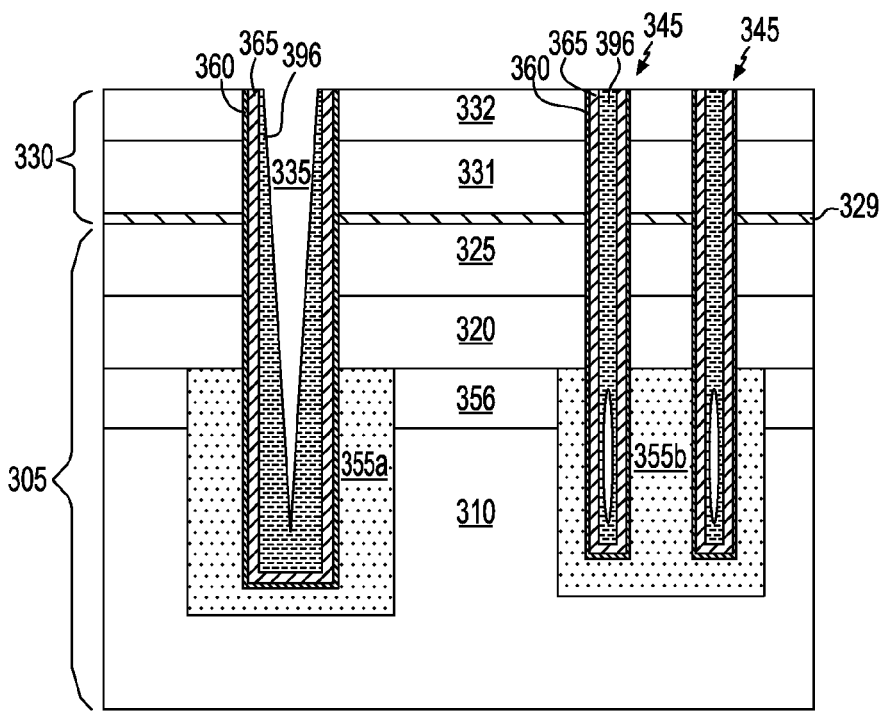
FIG. 16 is a side cross-sectional view depicting filling the contact trench and the capacitor trench with a doped semiconductor material, in accordance with one embodiment of the present disclosure.
Figure 17:
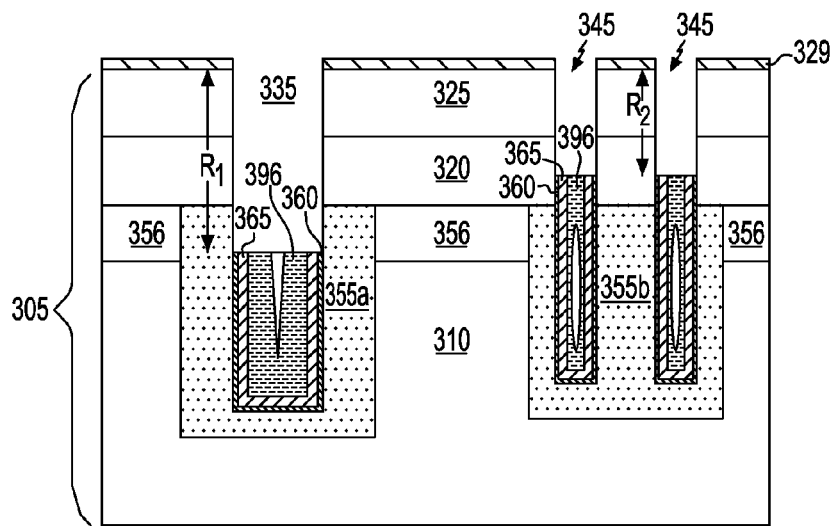
FIG. 17 is a side cross-sectional view depicting recessing the conformal dielectric layer, the conformal metal containing layer, and the doped semiconductor material within the contact trench and the capacitor trench, in accordance with one embodiment of the present disclosure.
Figure 18:
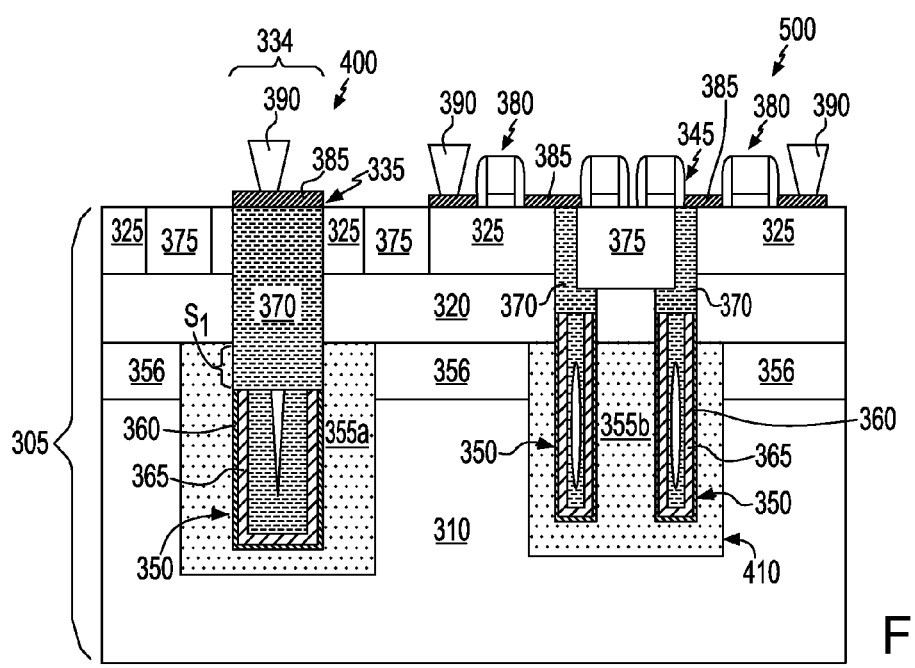
FIG. 18 is a side cross-sectional view depicting filling the contact trench and the capacitor trench with a conductive material, in accordance with one embodiment of the present disclosure.

FIGS. 12-18 depict another embodiment of the present disclosure. Referring to FIG. 18, in this embodiment, a semiconductor structure 500 is provided that includes a semiconductor on insulator (SOI) substrate 305 comprising an upper semiconductor layer 325, a dielectric layer 320, and a base semiconductor layer 310. A substrate contact 400 is present in a first trench, i.e., contact trench 335, that extends from an upper surface of the upper semiconductor layer 325 through the dielectric layer 320 into contact with the base semiconductor layer 310. The substrate contact 400 includes a conductive fill material 370 that is in direct contact with a doped region 355 in the base semiconductor layer 310 with a sidewall portion of the contact trench 335 and is separated from the base portion of the contact trench 335 by a conformal dielectric layer 350. The semiconductor structure 500 further includes a capacitor 410 present in a second trench, i.e., capacitor trench 345, that extends from the upper surface of the upper semiconductor layer 325 through the dielectric layer 320 into contact with a doped region 355 within the base semiconductor layer 310. In one embodiment, the capacitor 410 includes a buried plate, a node dielectric and an upper electrode. The node dielectric (identified by reference number 350) of the capacitor 410 is present on the entirety of the sidewalls and base portions of the capacitor trench that is present in the base semiconductor layer 310, and is identical in composition to the conformal dielectric layer 350 that is present in the contact trench 335.

Figure 12:
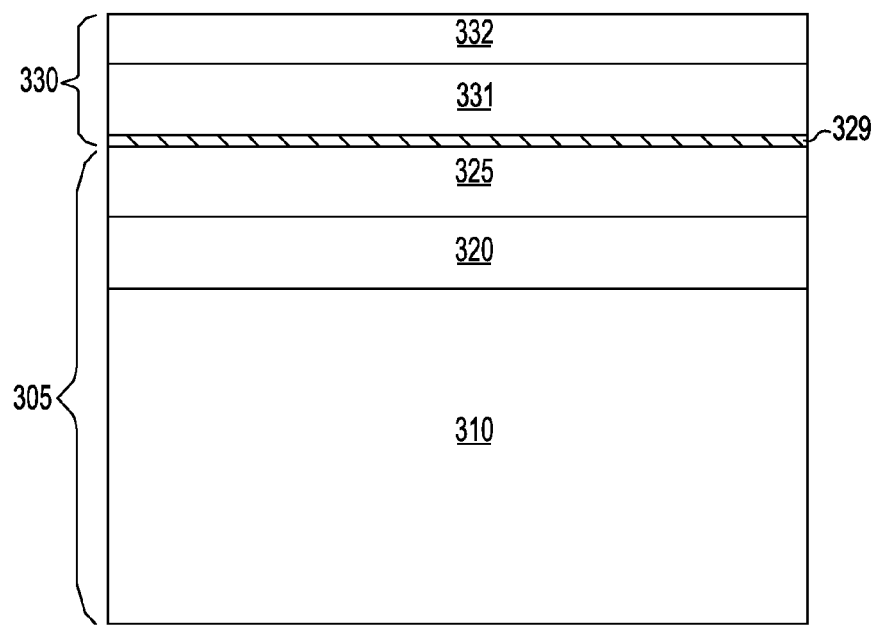
FIG. 12 is a side cross-sectional view of an initial structure used in one embodiment of a method of forming a contact to the base semiconductor layer of semiconductor on insulator substrate, in which the initial structure includes a pad dielectric stack present on a semiconductor on insulator (SOI) substrate, in accordance with the present disclosure.

FIG. 12 depicts one embodiment of an initial structure that may be used to provide the semiconductor structure 500 that is depicted in FIG. 18. The initial structure may include a semiconductor on insulator (SOI) substrate 305 and a pad dielectric stack 330. The semiconductor on insulator (SOI) substrate 305 that is depicted in FIG. 12 is similar to the semiconductor on insulator (SOI) substrate 5 that is depicted in FIG. 1, with the exception that in the embodiment that is depicted in FIGS. 12-18 the semiconductor on insulator (SOI) substrate 305 does not include an epitaxially grown semiconductor layer between the dielectric layer 320 and the base semiconductor layer 310. The base semiconductor layer 310 that is depicted in FIG. 12 is equivalent to the base semiconductor layer 310 that is described above with reference to FIG. 1. The dielectric layer 320 that is depicted in FIG. 12 is equivalent to the dielectric layer 20 that is described above with reference to FIG. 1. The semiconductor on insulator (SOI) substrate 305 further includes an upper semiconductor layer 325 that is in direct contact with the upper surface of the dielectric layer 320. The upper semiconductor layer 325 that is depicted in FIG. 12 is equivalent to the upper semiconductor layer 25 that is described above with reference to FIG. 1.

The pad dielectric stack 330 that is depicted in FIG. 12 is similar to the pad dielectric stack 30 that is depicted in FIG. 1. The pad dielectric stack 330 depicted in FIG. 12 includes an oxide containing pad dielectric layer 329 that is present on the upper surface of the upper semiconductor layer 325, a nitride containing pad dielectric layer 331 that is present on the upper surface of the oxide containing pad dielectric layer 329, and a hard mask dielectric layer 332 that is present on the upper surface of the nitride containing pad dielectric layer 331.

The oxide containing pad dielectric layer 329 may be composed of any oxide material, such as silicon oxide ($SiO_2$). The oxide containing pad dielectric layer 329 may be formed using deposition methods, such as chemical vapor deposition (CVD), or thermal growth methods, such as thermal oxidation. The oxide containing pad dielectric layer 329 may have a thickness ranging from 50 nm to 200 nm. In another example, the oxide containing pad dielectric layer 329 has a thickness ranging from 100 nm to 150 nm.

The nitride containing pad dielectric layer 331 and the hard mask dielectric layer 332 are equivalent to the nitride containing pad dielectric layer 31 and the hard mask dielectric layer 32 that are described above with reference to FIG. 1. Therefore, the description of the composition and method of forming the nitride containing pad dielectric layer 31 and the hard mask dielectric layer 32 that are depicted in FIG. 1 are suitable for the nitride containing pad dielectric layer 331 and the hard mask dielectric layer 332 that are depicted in FIG. 12.

Figure 13:
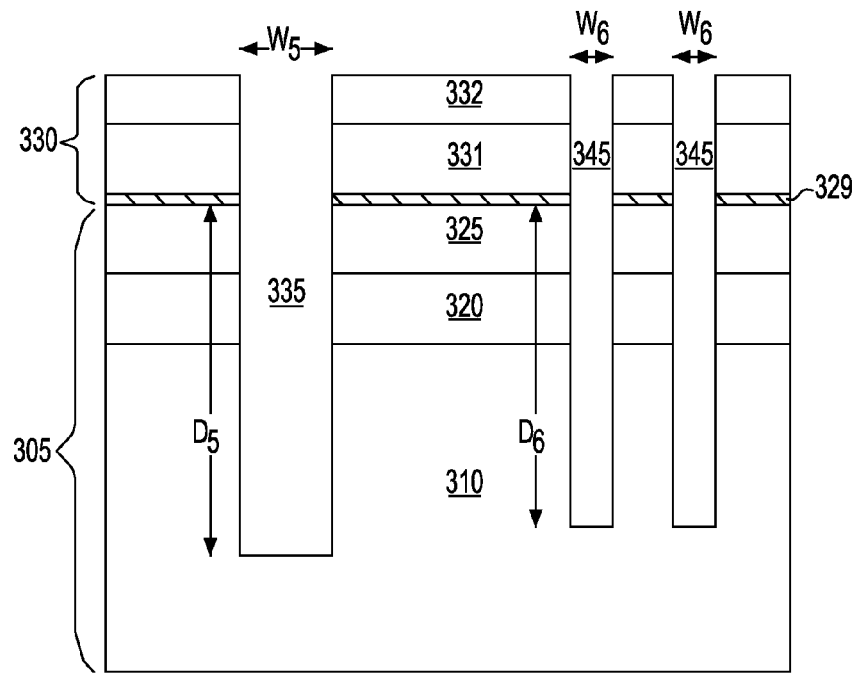
FIG. 13 is a side cross-sectional view depicting etching a contact trench and a capacitor trench into contact with the base semiconductor layer of the semiconductor or insulator substrate, in accordance with one embodiment of the present disclosure.

FIG. 13 depicting one embodiment of etching a contact trench 335 and a capacitor trench 345 into contact with the base semiconductor layer 310 of the semiconductor on insulator substrate (SOI) 305. The contact trench 335 and the capacitor trench 345 are formed using photolithography and etch processes similar to those described for forming the contact trench 35 and the capacitor trench 45 that are depicted in FIG. 1.

Referring to FIG. 13, the contact trench 335 and the capacitor trench 345 may be formed simultaneously using the same etch mask, i.e., a single etch mask is used to form each of the contact trench 335 and the capacitor trench 345. The etching operation may be carried out in a dry etching tool with an inductively coupled plasma for activating the etchant. Halogen-containing gases such as $CF_4$, $SF_6$, $CHF_3$, $Cl_2$, HBr, etc. are generally used as etching gases. In one embodiment, the contact trench 335 is etched to a greater depth into the base semiconductor layer 310 than the capacitor trench 345. In some embodiments, the depth of the contact trench 335 and the capacitor trench 345 is related to the width of the opening in the etch mask that corresponds to the contact trench 335 and the capacitor trench 345. More specifically, as the width of the opening in the etch mask is increased the etch rate of the semiconductor on insulator substrate (SOI) 305 increases due to aspect ratio dependent etching (ARDE) phenomena, or RIE lag. As a result, the etch process that simultaneously forms the contact trench 335 and the capacitor trench 345, etches the contact trench 335 to greater depths into the base semiconductor layer 310 than the capacitor trench 345.

In one embodiment, the contact trench 335 has a width W5 that is greater than the second width W6 of the capacitor trench 345. The first width W5 of the contact trench 335 may range from 0.1 µm to 1.0 µm. In another embodiment, the first width W5 of the contact trench 335 may range from 0.2 µm to 0.5 µm. The capacitor trench 345 has a width W6 that ranges from 0.05 µm to 0.5 µm. In another embodiment, the capacitor trench 345 has a width W6 that ranges from 0.1 µm to 0.25 µm.

The contact trench 335 has a depth D5 that is greater than depth D6 of the capacitor trench 345. In one embodiment, the contact trench 335 has a depth D5 that ranges from 2 µm to 10 µm, as measured from the upper surface of the upper semiconductor layer 325. In another embodiment, the contact trench 335 has a depth D5 that ranges from 4 µm to 7 µm. In one embodiment, the capacitor trench 345 has a depth D6 that ranges from 1 µm to 6 µm, as measured from the upper surface of the upper semiconductor layer 325. In another embodiment, the capacitor trench 345 has a depth D6 that ranges from 2 µm to 4 µm. It is noted that although FIG. 13 depicts forming two capacitor trenches 345, it is noted that the present disclosure is not limited to forming only two capacitor trenches 345, as any number of capacitor trenches 345 may be formed.

Figure 14:
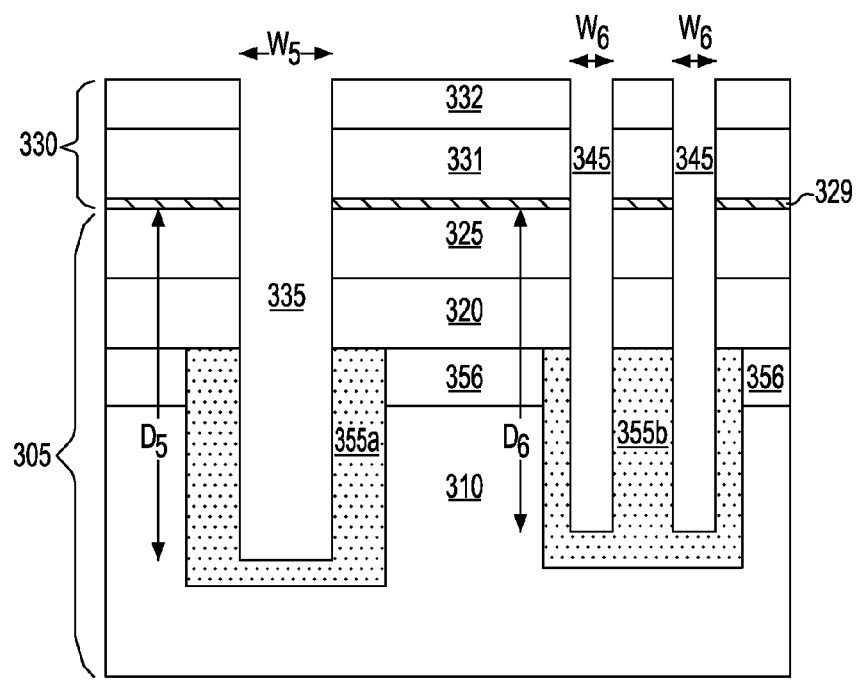
FIG. 14 is a side cross-sectional view depicting forming a doped region in the base semiconductor layer of the substrate adjacent to the contact trench and the capacitor trench, in accordance with one embodiment of the present disclosure.

FIG. 14 depicts forming first doped region 355a in the base semiconductor layer 310 of the substrate 305 adjacent to the contact trench 335 and a second doped region 355b in the base semiconductor layer 310 of the substrate adjacent to the capacitor trench 345. A doped connecting region 356 of the same dopant type connects the first doped region 355a that is adjacent to contact trench 335 and the second doped region 355b that is adjacent to the capacitor trench 345. The doped connecting region 356 can be formed with a mask and ion implantation. The first doped region 355a is contacted by the later formed substrate contact 400. The second doped region 355b may provide the buried plate electrode of the subsequently formed capacitor 410. In one embodiment, the first dopant region 355a, the second doped region 355b and the doped connecting region 356 are doped to an n-type conductivity. In some examples, the second doped region 355b may be referred to as an N+ buried plate diffusion region.

In one example, producing an n-type first and second doped region 355a, 355b may begin with introducing an n-type dopant source to the sidewalls of the contact trench 335 and the capacitor trench 345, and then thermally diffusing the dopant into the base semiconductor layer 310 of the semiconductor on insulator substrate 305. The dopant source to produce the N+ buried plate diffusion region may be introduced by ion-implanting an impurity, such as arsenic (As) or phosphorus (P), into the sidewall of the contact trench 335 and the capacitor trench 345. Arsenic (As) may be ion-injected into the contact trench 335 and the capacitor trench 345 under the conditions of an accelerating voltage, of about 20 kV, and at a dose of about $5 \times 10^{15}/cm^2$. Depositing a layer of N-type doped material, such as arsenic doped silicate glass, may also form the first and second doped regions 355a, 355b. After the impurities are introduced to the sidewalls of the contact trench 335 and the capacitor trench 345, the semiconductor on insulator (SOI) substrate 305 is then heated in an $N_2$ atmosphere at a temperature of about 900° C. for about 30 minutes, thereby diffusing N-type dopants into the base semiconductor layer 310. In another embodiment, a gaseous doping source, such as $AsH_3$ or plasma doping source, may also be used to dope the sidewall of the contact trench 335 and the capacitor trench 345 to form the first and second doped regions 355a, 355b.

Figure 15:
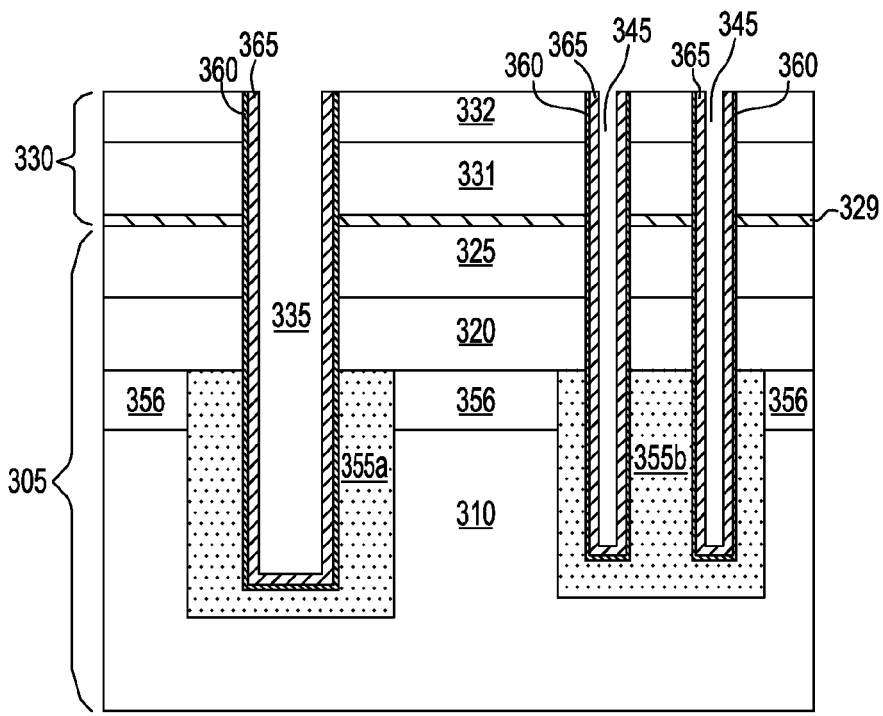
FIG. 15 is a side cross-sectional view depicting forming a conformal dielectric layer on the contact trench and the capacitor trench, and forming a conformal metal containing layer on the conformal dielectric layer, in accordance with one embodiment of the present disclosure.

FIG. 15 depicts one embodiment of forming a conformal dielectric layer 360 on the contact trench 335 and the capacitor trench 345, and forming a conformal metal containing layer 365 on the conformal dielectric layer 360. The conformal dielectric layer 360 is present on the base and sidewall portions of the contact trench 335 and the capacitor trench 345.

The conformal dielectric layer 360 may be composed of any dielectric material. For example, the conformal dielectric layer 360 employed at this stage may be any dielectric material including, but not limited to silicon nitride, silicon oxide, aluminum oxide, zirconium oxide, and hafnium oxide. The conformal dielectric layer 360 may be deposited on the sidewall and base portions of the contact trench 335 and the capacitor trench 345. The conformal dielectric layer 360 may be simultaneously formed on each of the contact trench 335 and the capacitor trench 345 using a blanket deposition. In one embodiment, the conformal dielectric layer 360 may be deposited using chemical vapor deposition (CVD) and/or atomic layer deposition (ALD). In another embodiment, the conformal dielectric layer 360 is formed using a growth process, such as thermal oxidation. In one embodiment, the conformal dielectric layer 360 may have a thickness of from 4.0 nm to 10.0 nm. In another embodiment, the conformal dielectric layer 360 may have a thickness of from 2.5 nm to 7.0 nm, with a thickness of from 3.0 nm to 5.0 nm being more typical.

The conformal metal layer 365 that is depicted in FIG. 17 is similar to the conformal metal layer 65 that is depicted in FIG. 4. Therefore, the description of the composition and method of forming the conformal metal layer 65 that is depicted in FIG. 4 is suitable for forming the conformal metal layer 365 that is depicted in FIG. 17.

FIG. 16 depicts one embodiment of filling the contact trench 335 and the capacitor trench 345 with a doped semiconductor material 396. The doped semiconductor material 396 may be a doped polysilicon. In the embodiments in which the doped semiconductor material 396 is provided by doped polysilicon, the dopant may be an n-type or p-type dopant having a dopant concentration ranging from $1 \times 10^{18}$ atoms/$cm^3$ to $1 \times 10^{20}$ atoms/$cm^3$. The doped semiconductor material 396 may be deposited using chemical vapor deposition (CVD). The doped semiconductor material 396 may be depositied using a method that encapsulates a void in the lower portion of the capacitor trenches 345.

FIG. 17 depicts recessing the conformal dielectric layer 360, the conformal metal layer 365, and the doped semiconductor material 396 within the contact trench 335 and the capacitor trench 345. At least a portion of the pad dielectric stack 330 may be removed from the upper surface of the upper semiconductor layer 325 of the semiconductor substrate 305. The pad dielectric stack 330 may be removed using a planarization process. One example of a planarization method that is suitable for removing the pad dielectric stack 330 is chemical mechanical planarization (CMP). In one example, the planarization method may remove the nitride containing pad dielectric layer 331 and the hard mask dielectric layer 332 stopping on the oxide containing pad dielectric layer 329.

In one embodiment, the conformal dielectric layer 360, the conformal metal layer 365, and the doped semiconductor material 396 is recessed using an anisotropic etch, such as reactive ion etch (RIE). In one example, the conformal dielectric layer 360, the conformal metal layer 365, and the doped semiconductor material 396 may be recessed using an etch that is selective to the oxide containing pad dielectric layer 329.

Referring to FIG. 17, the conformal dielectric layer 360, the conformal metal containing layer 365, and the doped semiconductor material 396 in capacitor trench 345 is typically recessed below the interface between the dielectric layer 320 and the upper semiconductor layer 325 to facilitate electrical connection between the upper semiconductor layer 325 and the doped semiconductor material 396. The upper surface of the conformal dielectric layer 360, the conformal metal containing layer 365 and the doped semiconductor material 396 is above the interface of the dielectric layer 320 and the base semiconductor layer 310 to prevent shorting to capacitor plate 355. Because the width W6 of the contact trench 335 is larger than width W5 of the capacitor trench 345, the aspect ratio dependent etching effect provides that the conformal dielectric layer 360, the conformal metal containing layer 365 and the doped semiconductor material 396 that is present in the contact trench 335 is recessed to a greater depth than the conformal dielectric layer 360, the conformal metal containing layer 365 and the doped semiconductor material 396 that is present in the capacitor trench 345. Because the conformal dielectric layer 360, the conformal metal containing layer 365 and the doped semiconductor material 396 that are present in the contact trench 335 are recessed below the upper surface of the base semiconductor layer 310, the subsequent conductive fill 370 will bring conductive fill 370 into direct contact with first doped region 355a that is adjacent to contact trench 335 and form plate contact.

In one embodiment, the material layers that are contained within the contact trench 335 are recessed by a dimension R1 ranging from 100 nm to 400 nm, as measured from the upper surface of the upper semiconductor layer 325. In another embodiment, the material layers that are contained within the contact trench 335 are recessed by a dimension R1 ranging from 200 nm to 300 nm, as measured from the upper surface of the semiconductor layer 325. In one embodiment, the material layers that are contained within the capacitor trench 345 are recessed by a dimension R2 ranging from 100 nm to 300 nm, as measured from the upper surface of the upper semiconductor layer 325. In another embodiment, the material layers that are contained within the capacitor trench 345 are recessed by a dimension R2 ranging from 150 nm to 250 nm, as measured from the upper surface of the semiconductor layer 325.

FIG. 18 depicts filling the contact trench 335 and the capacitor trench 345 with a conductive material 370. The conductive material 370 may be a doped semiconductor, such as doped polysilicon, or a metal. In the embodiments in which the conductive material 370 is provided by doped polysilicon, the dopant may be an n-type or p-type dopant having a dopant concentration ranging from $1 \times 10^{18}$ atoms/cm$^3$ to $1 \times 10^{20}$ atoms/cm$^3$. The conductive material 370 may be deposited using physical vapor deposition (PVD), such as plating or sputtering, or may be deposited using chemical vapor deposition (CVD). Following deposition of the conductive fill material 370, a planarization process, such as chemical mechanical planarization, may be employed. The planarization process may remove the oxide containing pad dielectric layer 329. Following removal of the oxide containing pad dielectric layer 329, the upper surface of the conductive material 370 that is present within the contact trench 335 and the capacitor trench 345 may be coplanar with the upper surface of the upper semiconductor layer 325.

The conductive material 370 is the portion of the substrate contact 400 that provides electrical communication to the base semiconductor layer 310 of the semiconductor on insulator (SOI) substrate 5. The conductive material 370 that is present within the contact trench 335 provides electrical contact to the doped plate region of the capacitor trench 345, with the help of the doped connecting region 356.

The capacitor 410, is provided by the second dopant region 355b present about the capacitor trenches 345 and the conformal dielectric layer 360, the conformal metal layer 365, and the doped semiconductor material 396 that are contained within the capacitor trench 345. The conformal dielectric layer 360 provides the node dielectric of the capacitor 410. The second doped region 355b provides the lower electrode, e.g., buried plate electrode, of the capacitor 410. The doped semiconductor material 396 and the conformal metal layer 365 provide the upper electrode of the capacitor 410. The conductive material 370 that is present within the capacitor trench 345 provides electrical contact to the upper electrode of the capacitor 410.

FIG. 18 further depicts forming isolation regions 375, e.g., shallow trench isolation (STI) regions, through the upper semiconductor layer 325 into contact with the dielectric layer 320. The isolation regions 375 are positioned to electrically isolate the substrate contact 400 from the capacitors 410. In one embodiment, isolation regions 375 may be employed to isolate adjacent capacitors 410 from one another.

In a DRAM application, access transistors 380 may be formed to the capacitors 410. The access transistors 380 may be field effect transistors. A field effect transistor is a semiconductor device in which output current, i.e., source-drain current, is controlled by the voltage applied to a gate structure. A field effect transistor has three terminals, i.e., a gate structure, a source region (not shown) and a drain region (not shown). The gate structure is a structure used to control output current, i.e., flow of carriers in the channel, of a semiconducting device, such as a field effect transistor, such as a field effect transistor, through electrical or magnetic fields. The gate structure is formed on a portion of the upper semiconductor layer 325 that is adjacent to the capacitor trench 345. The channel is the region between the source region and the drain region of a field effect transistor (FET) that becomes conductive when the semiconductor device is turned on. The source region, is a doped region in the transistor, in which majority carriers are flowing into the channel. The drain region is the doped region in transistor located at the end of the channel, in which carriers are flowing out of the semiconductor device through the drain region. The source regions and drain regions are formed within the upper semiconductor layer 325. One of the source regions and drain regions is in electrical communication with the conductive material 370 that is present within the capacitor trench 345. Although not depicted in FIGS. 5, 8 and 11, the above-described access transistors may be employed in combination with the capacitor structures described with reference to FIGS. 5, 8 and 11. In a capacitor application such as decoupling capacitors, access transistors are not needed.

Referring to FIG. 18, metal semiconductor alloy regions 385 may be formed as contact pad to the conductive material 370 that is present in the contact trench 335, and as a contact pad to the source region or drain region of the access transistor 380 that is not in direct electrical communication with the conductive material 370 within the capacitor trench 345. In one embodiment, the metal semiconductor alloy regions 385 may be composed of a silicide, such as nickel silicide, cobalt silicide or tungsten silicide.

A layer of dielectric material (not shown) may be blanket deposited atop the entire semiconductor on insulator (SOI) substrate and planarized. The blanket dielectric may be selected from the group consisting of silicon containing materials such as $SiO_2$, $Si_3N_4$, $SiO_xN_y$, SiC, SiCO, SiCOH, and SiCH compounds; the above-mentioned silicon containing materials with some or all of the Si replaced by Ge; carbon-doped oxides; inorganic oxides; inorganic polymers; hybrid polymers; organic polymers such as polyamides or SiLK; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable.

The blanket dielectric may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric is then patterned and etched to form via holes to the various contact pads 385. Following via formation interconnects 390 are formed by depositing a conductive metal into the via holes using conventional processing, such as CVD or plating. The conductive metal may include, but is not limited to: tungsten, copper, aluminum, silver, gold, and alloys thereof.

Backside substrate contacts are not suitable in the above-described embodiments, because the backside of the base semiconductor layer is in contact with the packaging layers of the device, which obstruct backside contacts from providing electrical communication to the base semiconductor layer of the substrate.

While the methods and structures disclosed herein have been particularly shown and described with respect to preferred embodiments thereof, it will be understood by those skilled in the art that the foregoing and other changes in forms and details may be made without departing from the spirit and scope of the present disclosure. It is therefore intended that the methods and structures disclosed herein not be limited to the exact forms and details described and illustrated, but fall within the scope of the appended claims.

What is claimed is:

1. A semiconductor structure comprising:
    a material stack comprising an n-type semiconductor layer on a base semiconductor layer, a dielectric layer on the n-type semiconductor layer, and an upper semiconductor layer present on the dielectric layer;
    a capacitor present in a capacitor trench and extending from the upper semiconductor layer through the dielectric layer into contact with the n-type semiconductor layer, wherein the capacitor comprises a node dielectric present on the sidewalls of the capacitor trench and an upper electrode filling at least a portion of the capacitor trench;
    a substrate contact present in a contact trench and extending from the upper semiconductor layer through the dielectric layer and the n-type semiconductor layer to a p-type doped region of the base semiconductor layer; and
    an isolation trench extending from the upper semiconductor layer through the dielectric layer and the n-type semiconductor layer and into, and in direct contact with, the base semiconductor layer, wherein the isolation trench is located between the capacitor trench and the contact trench, wherein the isolation trench includes a dielectric material on opposing sidewalls of the isolation trench and on a base portion of the isolation trench, and wherein a bottom surface of the isolation trench is lower than a bottom surface of the contact trench and a bottom surface of the capacitor trench.

2. The semiconductor structure of claim 1, wherein the base semiconductor layer comprises a semiconducting material selected from the group consisting of Si, strained Si, SiC, SiGe, SiGeC, Si alloys, Ge, Ge alloys, GaAs, InAs, InP, or a combination thereof.

3. The semiconductor structure of claim 1, wherein the n-type semiconductor layer is a semiconductor material that is selected from the group consisting of Si, strained Si, SiC, SiGe, SiGeC, Si alloys, Ge, Ge alloys, GaAs, InAs, InP, and a combination thereof.

4. The semiconductor structure of claim 1, wherein the n-type semiconductor layer is doped with phosphorus present in a concentration ranging from $1 \times 10^{18}$ atoms/$cm^3$ to $5 \times 10^{21}$ atoms/$cm^3$.

5. The semiconductor structure claim 1, wherein the n-type semiconductor layer has a thickness ranging from 1 μm to 5 μm.

6. The semiconductor structure of claim 1, wherein the dielectric layer is an oxide, nitride or oxynitride material.

7. The semiconductor structure of claim 1, wherein the dielectric layer has a thickness that ranges from 5.0 nm to 400.0 nm.

8. The semiconductor structure of claim 1, wherein the upper semiconductor layer comprises a semiconductor material selected from the group consisting of Si, strained Si, SiC, SiGe, SiGeC, Si alloys, Ge, Ge alloys, GaAs, InAs, InP, and a combination thereof.

9. The semiconductor structure of claim 1, wherein the upper semiconductor layer has a thickness ranging from 5.0 nm to 200.0 nm.

10. The semiconductor structure of claim 1, wherein the n-type semiconductor layer has a thickness that is greater than 1.0 micron, the contact trench is at least twice as wide as the capacitor trench.

11. The semiconductor structure of claim 1, wherein a width of an opening of the capacitor trench ranges from 0.03 μm to 0.2 μm, and a width of an opening of the contact trench ranges from 0.10 μm to 0.5 μm.

12. The semiconductor structure of claim 1, wherein the p-type dopant that is present in the p-type dopant region is at a concentration ranging from $1 \times 10^{17}$ atoms/$cm^3$ to $5 \times 10^{21}$ atoms/$cm^3$.

13. The semiconductor structure of claim 1, wherein a metal nitride layer is present in the contact trench and the capacitor trench that is selected from the group consisting of titanium nitride (TiN), tantalum nitride (TaN), tantalum silicon nitride (TaSiN), tungsten nitride (WN) and a combination thereof.

14. The semiconductor structure of claim 1, wherein the contact trench further comprises a silicide including Ni, Ti or a combination thereof.

* * * * *